United States Patent
Chong et al.

(10) Patent No.: US 11,695,011 B2
(45) Date of Patent: Jul. 4, 2023

(54) INTEGRATED CIRCUIT LAYOUT CELL, INTEGRATED CIRCUIT LAYOUT ARRANGEMENT, AND METHODS OF FORMING THE SAME

(71) Applicant: NANYANG TECHNOLOGICAL UNIVERSITY, Singapore (SG)

(72) Inventors: Kwen Siong Chong, Singapore (SG); Bah Hwee Gwee, Singapore (SG); Weng Geng Ho, Singapore (SG); Ne Kyaw Zaw Lwin, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 229 days.

(21) Appl. No.: 17/052,164

(22) PCT Filed: Apr. 30, 2019

(86) PCT No.: PCT/SG2019/050239
§ 371 (c)(1),
(2) Date: Oct. 30, 2020

(87) PCT Pub. No.: WO2019/212410
PCT Pub. Date: Nov. 7, 2019

(65) Prior Publication Data
US 2021/0050351 A1    Feb. 18, 2021

(30) Foreign Application Priority Data
May 2, 2018  (SG) .......................... 10201803673Y

(51) Int. Cl.
*H01L 27/098*  (2006.01)
*H01L 23/52*   (2006.01)
*H01L 29/06*   (2006.01)

(52) U.S. Cl.
CPC ............ *H01L 27/098* (2013.01); *H01L 23/52* (2013.01); *H01L 29/0615* (2013.01); *H01L 29/0696* (2013.01)

(58) Field of Classification Search
CPC ... H01L 27/098; H01L 23/52; H01L 29/0615; H01L 29/0696
See application file for complete search history.

(56) References Cited

U.S. PATENT DOCUMENTS

| 359,071 A | 3/1887 | Graham |
|---|---|---|
| 5,866,933 A | 2/1999 | Baukus et al. |

(Continued)

FOREIGN PATENT DOCUMENTS

| CN | 107181483 A | 9/2017 |
|---|---|---|
| JP | 2-67817 A | 3/1990 |
| WO | 2015/038587 A1 | 3/2015 |

OTHER PUBLICATIONS

Cocchi et al., "Circuit Camouflage Integration for Hardware IP Protection," *ACM/EDAC/IEEE Design Automation Conference (DAC)* 2014, San Francisco, California, USA, Jun. 1-5, 2014, p. 1-5.

(Continued)

*Primary Examiner* — Eugene Lee
(74) *Attorney, Agent, or Firm* — Seed IP Law Group LLP

(57) ABSTRACT

Various embodiments may provide an integrated circuit layout cell. The integrated circuit layout cell may include a doped region of a first conductivity type, a doped region of a second conductivity type opposite of the first conductivity type, and a further doped region of the first conductivity type at least partially within the doped region of the second conductivity type, and continuous with the doped region of the first conductivity type. The integrated circuit cell may include a first transistor having a control terminal, a first controlled terminal, and a second controlled terminal. The first controlled terminal and the second controlled terminal (Continued)

of the first transistor may include terminal regions of the second conductivity type formed within the further doped region of the first conductivity type. The integrated circuit cell may also include a second transistor.

20 Claims, 29 Drawing Sheets

(56) References Cited

U.S. PATENT DOCUMENTS

| | | | |
|---|---|---|---|
| 5,930,663 | A | 7/1999 | Baukus et al. |
| 6,064,110 | A | 5/2000 | Baukus et al. |
| 6,100,568 | A * | 8/2000 | Lage .................. H01L 27/1104 |
| | | | 257/E27.099 |
| 6,531,356 | B1 * | 3/2003 | Hayashi ............ H01L 21/76202 |
| | | | 257/338 |
| 6,613,661 | B1 | 9/2003 | Baukus et al. |
| 6,653,694 | B1 * | 11/2003 | Osanai ................ H01L 27/0883 |
| | | | 257/E27.061 |
| 6,815,816 | B1 | 11/2004 | Clark, Jr. et al. |
| 6,900,081 | B2 * | 5/2005 | Kitamura .......... H01L 21/82385 |
| | | | 438/129 |
| 6,979,606 | B2 | 12/2005 | Chow et al. |
| 7,217,977 | B2 | 5/2007 | Chow et al. |
| 7,242,063 | B1 | 7/2007 | Chow et al. |
| 7,294,935 | B2 | 11/2007 | Chow et al. |
| 7,816,201 | B2 * | 10/2010 | Kato ............... H01L 21/823857 |
| | | | 257/E21.633 |
| 8,111,089 | B2 | 2/2012 | Cocchi et al. |
| 8,151,235 | B2 | 4/2012 | Chow et al. |
| 8,258,583 | B1 | 9/2012 | Chow et al. |
| 8,510,700 | B2 | 8/2013 | Cocchi et al. |
| 8,524,553 | B2 | 9/2013 | Chow et al. |
| 2004/0144998 | A1 | 7/2004 | Chow et al. |
| 2005/0029616 | A1 * | 2/2005 | Noda ............... H01L 21/823462 |
| | | | 438/296 |
| 2012/0175634 | A1 * | 7/2012 | Weis ............... H01L 21/823418 |
| | | | 257/E27.06 |
| 2013/0320491 | A1 | 12/2013 | Thacker, III et al. |
| 2017/0359071 | A1 | 12/2017 | Cocchi et al. |

OTHER PUBLICATIONS

Cocchi, "Camouflage circuitry and programmable cells to secure semiconductor designs during manufacturing," *National Aerospace and Electronics Conference (NAECON) 2015*, Dayton, Ohio, USA, Jun. 16-19, 2015, p. 141-145.

Collantes et al., "Threshold-Dependent Camouflaged Cells to Secure Circuits Against Reverse Engineering Attacks," *IEEE Computer Society Annual Symposium on VLSI 2016*, Pittsburgh, Pennsylvania, USA., Jul. 11-13, 2016, p. 1-6.

Erbagci et al., "A Secure Camouflaged Threshold Voltage Defined Logic Family," *IEEE International Symposium on Hardware Oriented Security and Trust (HOST) 2016*, McLean, Virginia, USA, May 3-5, 2016, p. 229-235.

Li et al., "Provably Secure Camouflaging Strategy for IC Protection," *IEEE Transactions on Computer-Aided Design of Integrated Circuits and Systems* 38(8):1399-1412, 2019.

Nirmala et al., "A Novel Threshold Voltage Defined Switch for Circuit Camouflaging," *21st IEEE European Test Symposium (ETS) 2016*, Amsterdam, Netherlands, May 23-27, 2016, p. 1-2.

Rajendran et al., "Security Analysis of Integrated Circuit Camouflaging," *ACM SIGSAC Conference on Computer and Communications Security (CCS) 2013*, Berlin, Germany, Nov. 4-8, 2013, p. 709-720.

Rajendran et al., "Regaining Trust in VLSI Design: Design-for-Trust Techniques," *Proc. of the IEEE* 102(8):1266-1282, 2014.

Rostami et al., "A Primer on Hardware Security: Models, Methods, and Metrics," *Proc. of the IEEE* 102(8):1283-1295, 2014.

Yasin et al., "CamoPerturb: Secure IC Camouflaging for Minterm Protection," *IEEE/ACM International Conference on Computer-Aided Design (ICCAD) 2016*, Austin, Texas, USA, Nov. 7-10, 2016, p. 1-8.

* cited by examiner (a)

(b)

(c)

(d)

(e)

(f)

INTEGRATED CIRCUIT LAYOUT CELL, INTEGRATED CIRCUIT LAYOUT ARRANGEMENT, AND METHODS OF FORMING THE SAME

CROSS-REFERENCE TO RELATED APPLICATION

This application claims the benefit of priority of Singapore application No. 10201803673Y filed May 2, 2018, the contents of it being hereby incorporated by reference in its entirety for all purposes.

TECHNICAL FIELD

Various aspects of this disclosure relate to an integrated circuit layout cell. Various aspects of this disclosure relate to an integrated circuit layout arrangement. Various aspects of this disclosure relate to a method of forming an integrated circuit layout cell. Various aspects of this disclosure relate to a method of forming an integrated circuit layout arrangement.

BACKGROUND

Reverse engineering on Integrated Circuits involves extracting design information from a chip, and reproducing the design or part of it based on the extracted information. Reverse engineering may serve a variety of purposes. On one hand, companies may use reverse engineering to detect if any other companies infringe their intellectual property (IP). On the other hand, adversaries may use reverse engineering to copy integrated circuit designs. For the latter, techniques may be employed to prevent or deter reverse engineering, mitigating the risk of IP theft.

FIG. 1 depicts (a) the typical design flow for making an integrated circuit chip, and (b) the typical reverse engineering process flow to extract the functionality of the integrated circuit chip. For the design flow, a logic function may be mapped to produce a gate netlist through Logic Synthesis 102 where various library cells are connected together to realize the said overall logic functions. Thereafter, Physical Synthesis 104 may be used to produce a layout view based on the gate netlist. Finally, an integrated circuit chip performing the overall logic functions may be fabricated via the integrated circuit fabrication process 106. For the reverse engineering process flow, the integrated circuit chip may be de-layered to obtain the image information (e.g. hundreds of thousands of small images) of the layout containing various interconnect and transistor information. This process is called Delayering and Imaging 108. With the chip image information, Image Annotation 110 may be used to stitch all the image information to produce the gate netlist. With the gate netlist, Netlist Analysis 112 may be used to extract the possible functionality of the gate netlist.

FIG. 2A is a microscope image of an integrated circuit. It may be identified through reverse engineering the various transistors (and their associated interconnects). Should the layout views of the circuits (or part of them) look similar, the difficulties of reverse engineering may be increased. Integrated circuits containing these look-a-like cells may be called camouflage integrated circuits, while the look-a-like cells may be called camouflage cells. FIG. 2B is an image showing two look-a-like cells having different logical functions.

Camouflage integrated circuits have been used as a means to prevent reverse engineering on integrated circuits. Referring back to the design flow in FIG. 1(a), the techniques involving camouflage integrated circuits may be applied to the Logic Synthesis step, the Physical Synthesis step, the Fabrication step, or a combination of them. At the Logic Synthesis step, camouflage cells or programmable cells with similar layout views (for various logical functions) may be used. At the Physical Synthesis step, reported techniques may include metal filling, filler filling, and cell placements, making the overall layout view similar. At the fabrication level, reported techniques may include dummy via insertion, well implants, dummy transistors, metallization, light density doping, and controlled layers.

Table I summarizes various reported techniques for camouflage integrated circuits, as well as their pros and cons.

TABLE I

State of the art for camouflage integrated circuits

| Category | Techniques | Pros | Cons |
| --- | --- | --- | --- |
| Logic Synthesis | Threshold-dependent logic | Same physical layout | Large power/area/speed overheads |
| | | Multiple functions | Threshold control |
| | Threshold voltage defined logic/switch | Same physical layout | Large power/area/speed overheads |
| | | Multiple functions | Mask programmed |
| | Programmable cell | Same physical layout | Programmable camouflage connector is identifiable |
| | | Configurable for multiple functions | Netlist is extractable |
| | Voltage controlled multiplexer | Same physical layout | Large power/area/speed overheads |
| | | Multiple functions | Voltage control |
| Physical Synthesis | Filler | Filled and routed gaps | Low resistance towards metal layer tracing |
| | Metallization | Uncertain cell boundaries | Low resistant towards voltage source tracing |
| Fabrication | Dummy via | Same physical layout | Large power/area/speed overheads |
| | | | Special process needed |
| | Well implant | Confused electrical path | Low resistance towards brute force attack |
| | | | Special process needed |

TABLE I-continued

State of the art for camouflage integrated circuits

| Category | Techniques | Pros | Cons |
|---|---|---|---|
| | Dummy transistor | Confused operable transistors | Low resistance towards brute force attack Special process needed |
| | Metallization | Hidden metal layers | Low resistance towards brute force attack Special process needed |
| | Light density dopant | Hidden devices' functionalities | Low resistance towards brute force attack Special process needed |
| | Controlled layers | Hidden devices' structure | Low resistant towards brute force attack Special process needed |

In general, process modifications at Fabrication may be costly and may not be well-accepted. The techniques in Physical Synthesis may become largely ineffective due to the advancement of the reverse engineering techniques involving Delayering & Imaging, Image Annotation and/or Netlist Analysis.

The techniques involved in Logic Synthesis, including various camouflage cell implementations, may provide good alternatives. However, these camouflage cells generally suffer from larger power consumption, as well as higher speed and area overheads, and varying camouflage effectiveness. The camouflage cells in FIG. 2B may be ineffective as the contacts on various active regions (i.e. n-channel metal oxide semiconductor or NMOS regions, and p-channel metal oxide semiconductor or PMOS regions) are visible and provide hints for reverse engineering. The technology advancements on Delayering and Imaging, and Image Annotation may largely compromise the degree of security offered by most simple camouflage cells.

FIG. 3A shows a schematic of a state-of-the-art dynamic-logic-based threshold-dependent cell. FIG. 3B shows a schematic of a state-of-the art pass-logic-based threshold-dependent cell. FIG. 3C shows a schematic of a state-of-the art transmission-gate-based programmable cell. Of the various camouflage cells shown, it may be worthwhile to mention that layout of the various gate of the programmable camouflage cell depicted in FIG. 3C may be realized to be identical. FIG. 3C depicts the schematic for a gate having three inputs, A, B and C, and one output Z. By configuring inputs A and B, and by pre-programming the input C, different logical functions may be achieved. Such a camouflage gate may be laid out with the same physical layout, but may have two limitations. Firstly, it is imperative to camouflage the programmable camouflage connectors connected to the input C. If the programmable camouflage connector is identified (to be connected to either '0' or '1') in Delayering & Imaging, the camouflage gate may still be identified in Netlist Analysis. An improved version uses a latch to control the input, but the latch may unavoidably increase the area overhead. Secondly, the netlist of the gate, extracted from the layout, can often be considered as correct in Image Annotation. Therefore, Netlist Analysis may still be effective to obtain some useful information about the circuit. Collectively, it may still be possible to identify the camouflage cells embodying the reported programmable techniques. This may also apply to look-up-table (LUT) cells in field-programmable gate arrays (FPGAs) or other programmable cells when advanced analysis flow with advanced statistical analysis tools are available.

SUMMARY

Various embodiments may provide an integrated circuit layout cell. The integrated circuit layout cell may include a doped region of a first conductivity type. The integrated circuit layout cell may also include a doped region of a second conductivity type opposite of the first conductivity type. The integrated circuit cell may additionally include a further doped region of the first conductivity type at least partially within the doped region of the second conductivity type, and continuous with the doped region of the first conductivity type. The integrated circuit cell may include a first transistor having a control terminal, a first controlled terminal, and a second controlled terminal. The first controlled terminal and the second controlled terminal of the first transistor may include terminal regions of the second conductivity type formed within the further doped region of the first conductivity type. The integrated circuit cell may also include a second transistor having a control terminal, a first controlled terminal, and a second controlled terminal. The first controlled terminal and the second controlled terminal of the second transistor may include terminal regions of the first conductivity type. The first controlled terminal of the first transistor may be in electrical connection with the first controlled terminal of the second transistor. The second controlled terminal of the first transistor may be in electrical connection with the second controlled terminal of the second transistor.

Various embodiments may provide an integrated circuit layout arrangement. The integrated circuit layout arrangement may include a first integrated circuit layout cell. The first integrated circuit layout cell may include a doped region of a first conductivity type. The first integrated circuit layout cell may also include a doped region of a second conductivity type opposite of the first conductivity type. The first integrated circuit layout cell may additionally include a further doped region of the first conductivity type at least partially within the doped region of the second conductivity type, and continuous with the doped region of the first conductivity type. The first integrated circuit layout cell may further include a first transistor having a control terminal, a first controlled terminal, and a second controlled terminal. The first controlled terminal and the second controlled terminal of the first transistor including terminal regions of the second conductivity type may be formed within the further doped region of the first conductivity type. The first integrated circuit layout cell may also include a second transistor having a control terminal, a first controlled terminal, and a second controlled terminal. The first controlled terminal and the second controlled terminal of the second transistor may include terminal regions of the first conductivity type. The first controlled terminal of the first transistor may be in electrical connection with the first controlled terminal of the second transistor. The second controlled terminal of the first transistor may be in electrical connection with the second controlled terminal of the second transistor. The integrated circuit layout arrangement may additionally include a second integrated circuit layout cell including a p-channel transistor and an n-channel transistor. The p-channel transistor of the second integrated circuit layout cell may include a control terminal, a first controlled terminal, and a second controlled terminal. The n-channel transistor of the second integrated circuit layout cell may include a control terminal, a first controlled terminal, and a second controlled terminal. The first controlled terminal of the p-channel transistor of the second integrated circuit layout cell may be in electrical connection with the first controlled terminal of the n-channel transistor of the second integrated circuit layout cell. The second controlled terminal of the p-channel transistor of the second integrated circuit layout cell may be in electrical connection with the second controlled terminal of the n-channel transistor of the second integrated circuit layout cell.

Various embodiments may provide a method of forming an integrated circuit layout cell. The method may include forming a doped region of a first conductivity type. The method may also include forming a doped region of a second conductivity type opposite of the first conductivity type. The method may additionally include forming a further doped region of the first conductivity type at least partially within the doped region of the second conductivity type, and continuous with the doped region of the first conductivity type. The method may also include forming a first transistor having a control terminal, a first controlled terminal, and a second controlled terminal. The first controlled terminal and the second controlled terminal of the first transistor may include terminal regions of the second conductivity type formed within the further doped region of the first conductivity type. The method may additionally include forming a second transistor having a control terminal, a first controlled terminal, and a second controlled terminal. The first controlled terminal and the second controlled terminal of the second transistor may include terminal regions of the first conductivity type. The first controlled terminal of the first transistor may be in electrical connection with the first controlled terminal of the second transistor. The second controlled terminal of the first transistor may be in electrical connection with the second controlled terminal of the second transistor.

Various embodiments may provide a method of forming an integrated circuit layout arrangement. The method may include forming a first integrated circuit layout cell including a doped region of a first conductivity type, a doped region of a second conductivity type opposite of the first conductivity type, and a further doped region of the first conductivity type at least partially within the doped region of the second conductivity type, and continuous with the doped region of the first conductivity type. The first integrated layout cell may also include a first transistor having a control terminal, a first controlled terminal, and a second controlled terminal. The first controlled terminal and the second controlled terminal of the first transistor may include terminal regions of the second conductivity type formed within the further doped region of the first conductivity type. The first integrated layout cell may additionally include a second transistor having a control terminal, a first controlled terminal, and a second controlled terminal. The first controlled terminal and the second controlled terminal of the second transistor may include terminal regions of the first conductivity type. The first controlled terminal of the first transistor may be in electrical connection with the first controlled terminal of the second transistor. The second controlled terminal of the first transistor may be in electrical connection with the second controlled terminal of the second transistor. The method may also include forming a second integrated circuit layout cell including a p-channel transistor and an n-channel transistor. The p-channel transistor of the second integrated circuit layout cell may include a control terminal, a first controlled terminal, and a second controlled terminal. The n-channel transistor of the second integrated circuit layout cell may include a control terminal, a first controlled terminal, and a second controlled terminal. The first controlled terminal of the p-channel transistor of the second integrated circuit layout cell may be in electrical connection with the first controlled terminal of the n-channel transistor of the second integrated circuit layout cell. The second controlled terminal of the p-channel transistor of the second integrated circuit layout cell may be in electrical connection with the second controlled terminal of the n-channel transistor of the second integrated circuit layout cell.

BRIEF DESCRIPTION OF THE DRAWINGS

The invention will be better understood with reference to the detailed description when considered in conjunction with the non-limiting examples and the accompanying drawings, in which.

DETAILED DESCRIPTION

Figure 1:
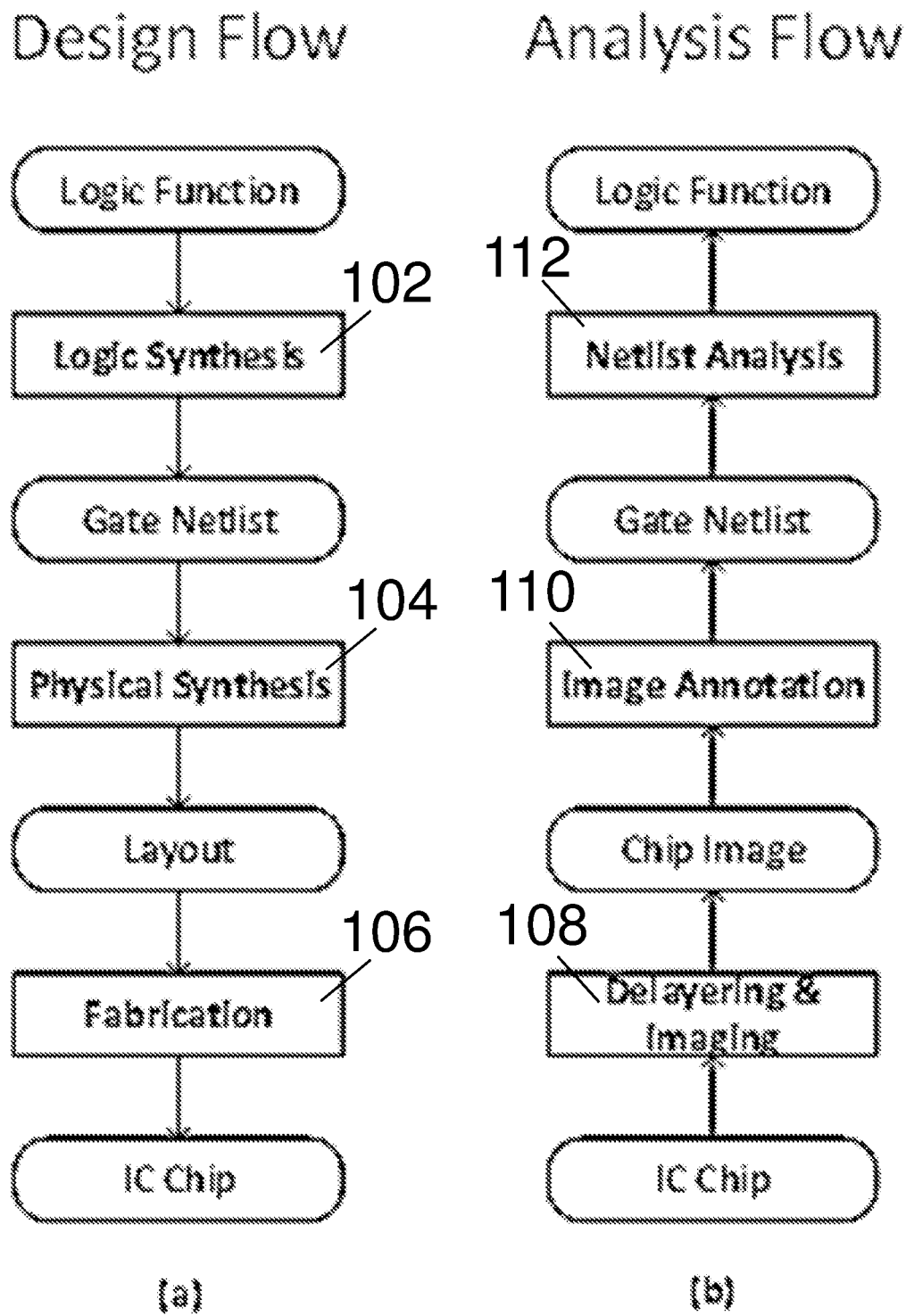
FIG. 1 depicts (a) the typical design flow for making an integrated circuit (IC) chip, and (b) the typical reverse engineering process flow to extract the functionality of the IC chip.
Figure 2A:
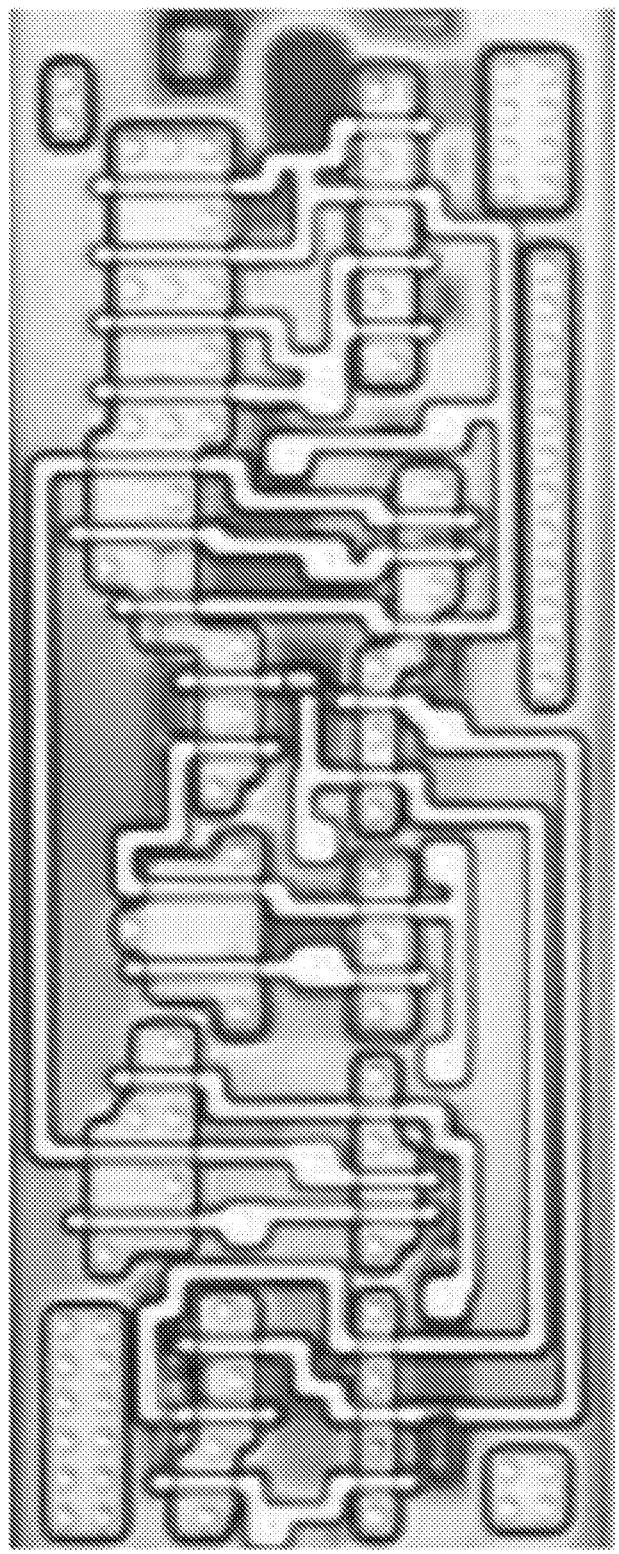
FIG. 2A is a microscope image of an integrated circuit (IC).
Figure 2B:
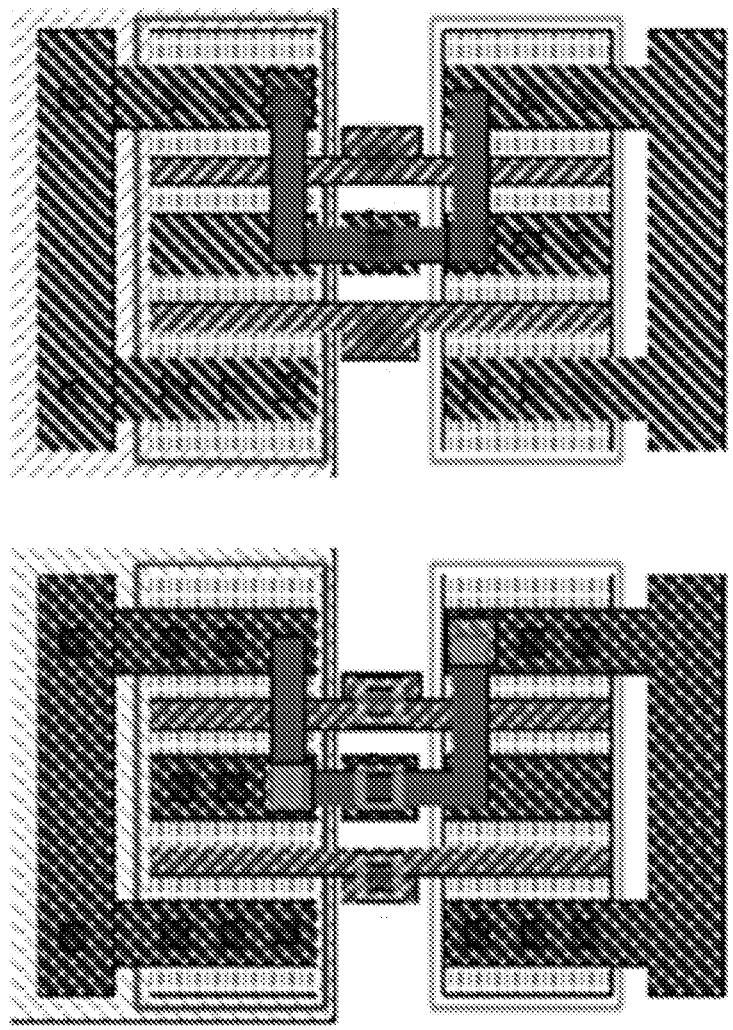
FIG. 2B is an image showing two look-a-like cells having different logical functions.
Figure 3A:
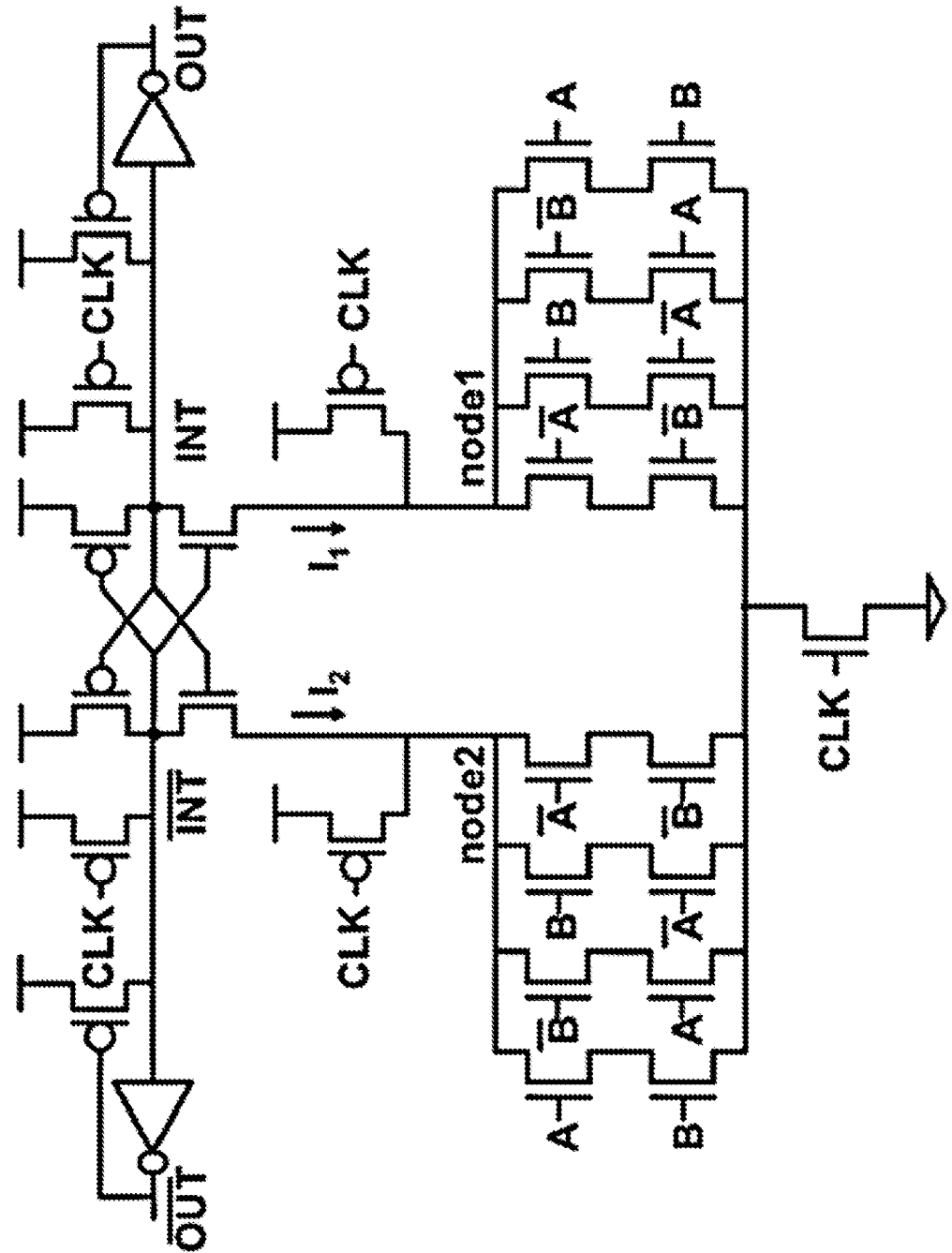
FIG. 3A shows a schematic of a state-of-the-art dynamic-logic-based threshold-dependent cell.
Figure 3B:
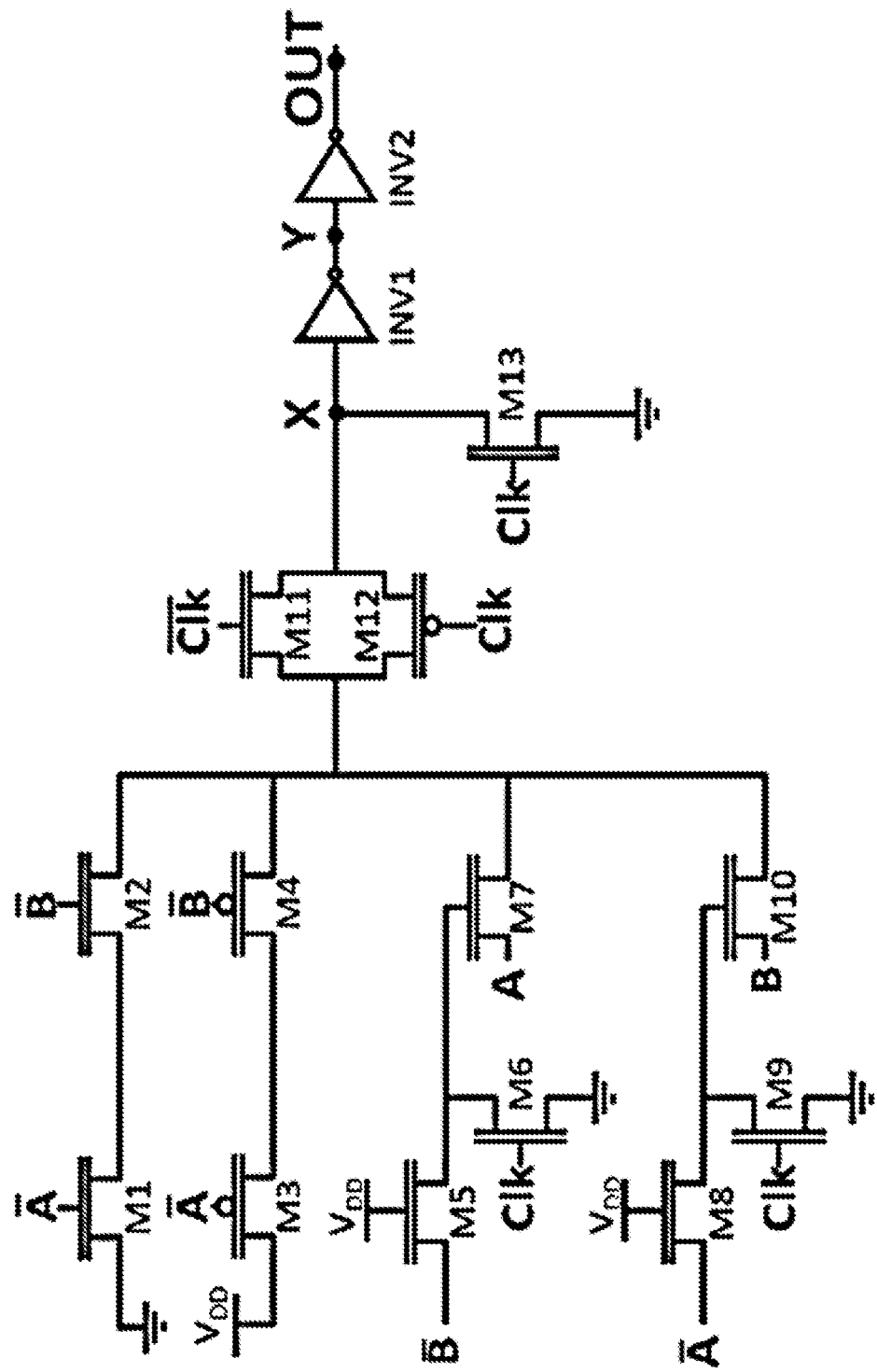
FIG. 3B shows a schematic of a state-of-the art pass-logic-based threshold-dependent cell.
Figure 3C:
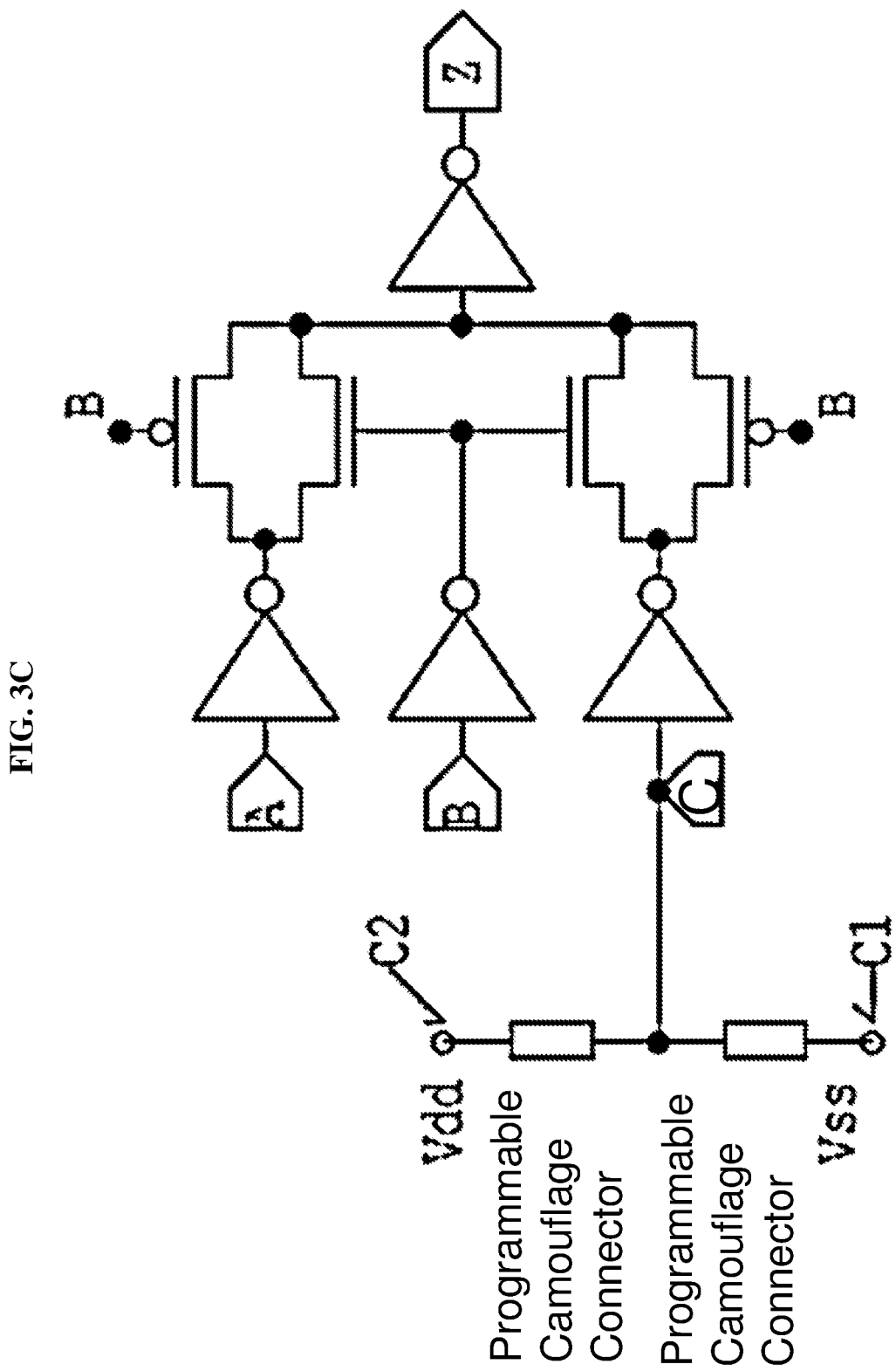
FIG. 3C shows a schematic of a state-of-the art transmission-gate-based programmable cell.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods, cells, or arrangements are analogously valid for the other methods, cells, or arrangement. Similarly, embodiments described in the context of a method are analogously valid for a cell or an arrangement, and vice versa.

A "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail may also be understood as a "circuit" in accordance with various alternative embodiments.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

In view of the limitations of reported camouflage cells which are either too complex (circuit-wise or process-wise for scalability) or not effective (in terms of protection), various embodiments may provide a solution in which the area/power/delay overheads are low, and yet with a high degree of protection against reverse engineering. Various embodiments may address or mitigate the problems or solution faced by conventional circuits or methods.

In the context of this disclosure, a "p-channel Field Effect Transistor region" or "PFET region" may refer to a region of the substrate that is doped with n-type dopants (e.g. phosphorous or nitrogen), such as an n-well. Conversely, an "n-channel Field Effect Transistor region" or "NFET region" may refer to a region of the substrate that is doped with p-type dopants (e.g. boron), such as a p-well or p-doped substrate. The p-channel and n-channel refer to the conductivity types of channels formed in a field effect transistor.

Within a PFET region (which may be an n-well or the n-doped substrate), a "p-channel Field Effect Transistor" or "PFET" or conveniently called "p-channel conductivity transistor" or "p-channel transistor" may be formed if a gate (e.g. poly-crystalline layer) is over a portion of the substrate between two doped diffusion p-regions. The two p-doped diffusion p-regions serve as the controlled terminals, i.e. the source and the drain. When a low voltage, which is lower than the supply voltage by the threshold voltage of the p-channel transistor, is applied to the control terminal, a p-channel may formed at the portion of the substrate between the two doped diffusion p-regions, thus activating the p-channel transistor such that drain and source of the p-channel transistor are electrically connected.

Likewise, within an NFET region (which may be a p-well or the p-doped substrate), an "n-channel Field Effect Transistor" or "NFET" or conveniently called "n-channel conductivity transistor" or "n-channel transistor" may be formed if a gate (e.g. poly-crystalline layer) is over a portion of the substrate between two doped diffusion n-regions. The two n-doped diffusion n-regions serve as the controlled terminals, i.e. the source and the drain. When a high voltage, which is higher than ground (i.e. at about 0 V) by the threshold voltage of the n-channel transistor, is applied to the control terminal, an n-channel may formed at the portion of the substrate between the two doped diffusion n-regions, thus activating the n-channel transistor such that drain and source of the n-channel transistors are electrically connected.

In the context of this disclosure, a p-channel transistor may refer to a p-channel metal oxide semiconductor (PMOS) transistor. A p-channel transistor may also refer to a p-channel silicon-on-insulator transistor or conveniently called "p-channel SOI transistor". A p-channel transistor may also refer to a p-channel fin field effect transistor or conveniently called "p-channel FinFET".

Similarly, an n-channel transistor may refer to an n-channel metal oxide semiconductor (NMOS) transistor. An n-channel transistor may also refer to an n-channel SOI transistor or conveniently called "n-channel SOI transistor". An n-channel transistor may also refer to an n-channel fin field effect transistor or conveniently called "n-channel FinFET".

Figure 4A:
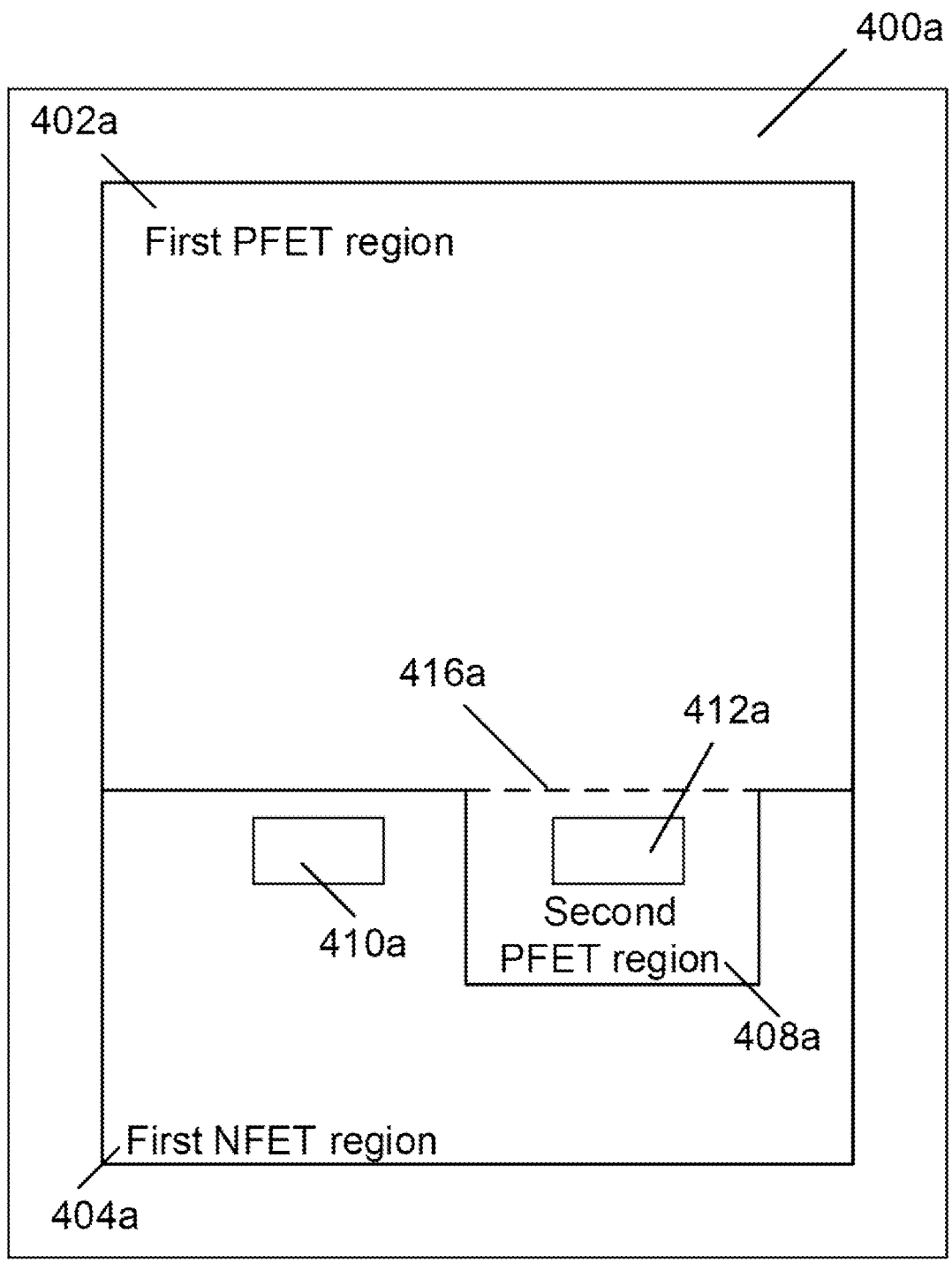
FIG. 4A is a first general illustration of an integrated circuit layout cell according to various embodiments.

FIG. 4A is a first general illustration of an integrated circuit layout cell 400a according to various embodiments.

The integrated circuit layout cell 400a may include a doped region 402a of a first conductivity type. The doped region 402a of the first conductivity type may be a first PFET region. The integrated circuit layout cell 400a may also include a doped region 404a of a second conductivity type opposite of the first conductivity type. The doped region 404a may be a first NFET region. The integrated circuit cell 400a may additionally include a further doped region 408a of the first conductivity type, which may be at least partially within the doped region 404a of the second conductivity type, and which may be continuous with the doped region 402a of the first conductivity type. The further doped region 408a may be a second PFET region.

The integrated circuit layout cell 400a may include a first transistor 412a having a control terminal, a first controlled terminal, and a second controlled terminal. The first controlled terminal and the second controlled terminal of the first transistor 412a may include terminal regions of the second conductivity type formed within the further doped region 408a of the first conductivity type, i.e. the second PFET region. The first transistor 412a may be a p-channel transistor.

The integrated circuit cell 400a may also include a second transistor 410a having a control terminal, a first controlled terminal, and a second controlled terminal. The first controlled terminal and the second controlled terminal of the second transistor 410a may include terminal regions of the first conductivity type formed within the doped region 404a of the second conductivity type, i.e. the first NFET region. The second transistor 410a may be an n-channel transistor.

The first controlled terminal of the first transistor 412a may be in electrical connection with the first controlled terminal of the second transistor 410a. The second controlled terminal of the first transistor 412a may be in electrical connection with the second controlled terminal of the second transistor 410a.

For illustration as seen in FIG. 4A, the first and second PFET regions 402a and 408a may be viewed with two regions partitioned by the dashed line 416a. The first and second PFET regions 402a and 408a are continuous.

FIG. 4A serves to illustrate the different features of the integrated circuit layout cell 400a according to various embodiments, and does not limit for instance, the sizes, arrangement, orientation etc. of the different features.

The regions 402a, 404a, 408a may be formed within a substrate, e.g. a semiconductor substrate such as silicon substrate. The regions 402a, 404a, 408a may extend from a surface of the substrate to predetermined depths of the substrate.

The p-wells and the n-wells may not be easily distinguished from a microscopic image of an integrated circuit. During reverse engineering, the p-channel transistor 412a may be erroneously recognized as an n-channel transistor, while the n-channel transistor 410a may be erroneously recognized as a p-channel transistor.

Figure 4B:
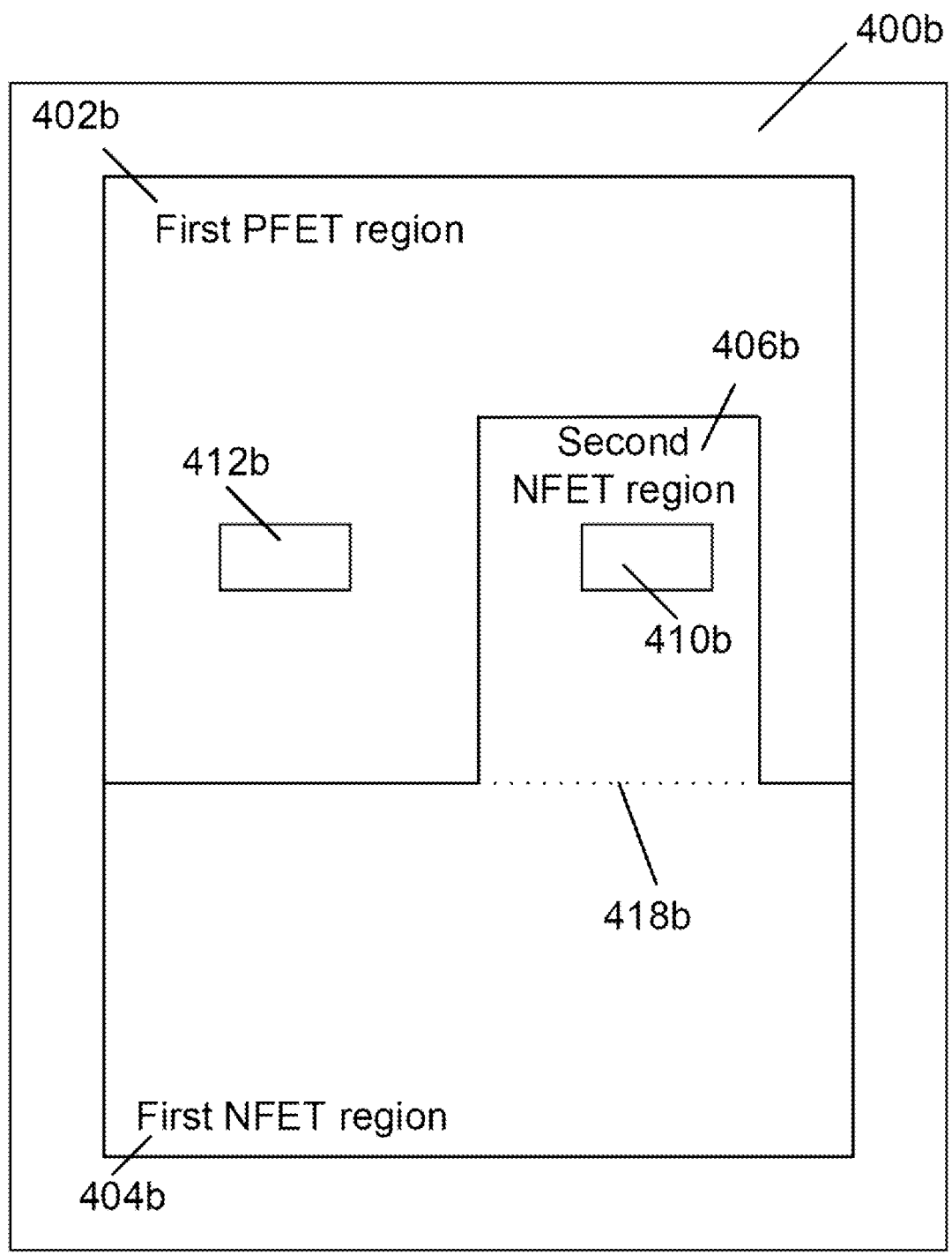
FIG. 4B is a second general illustration of an integrated circuit layout cell according to various embodiments.

FIG. 4B is a second general illustration of an integrated circuit layout cell 400b according to various embodiments.

The integrated circuit layout cell 400b may include a doped region 404b of a first conductivity type. The doped region 404b of the first conductivity type may be a first NFET region. The integrated circuit layout cell 400b may also include a doped region 402b of a second conductivity type opposite of the first conductivity type. The doped region 402b may be a first PFET region. The integrated circuit cell 400b may additionally include a further doped region 406b of the first conductivity type, which may be at least partially within the doped region 402b of the second conductivity type, and which may be continuous with the doped region 404b of the first conductivity type. The further doped region 406b may be a second NFET region.

The integrated circuit cell 400b may include a first transistor 410b having a control terminal, a first controlled terminal, and a second controlled terminal. The first controlled terminal and the second controlled terminal of the first transistor may include terminal regions of the second conductivity type formed within the further doped region 406b of the first conductivity type, i.e. the second NFET region. The first transistor 410b may be an n-channel transistor.

The integrated circuit cell 400b may also include a second transistor 412b having a control terminal, a first controlled terminal, and a second controlled terminal. The first controlled terminal and the second controlled terminal of the second transistor 412b may include terminal regions of the first conductivity type formed within the doped region 402b of the second conductivity type, i.e. the first PFET region. The second transistor 412b may be a p-channel transistor.

The first controlled terminal of the first transistor 410b may be in electrical connection with the first controlled terminal of the second transistor 412b. The second controlled terminal of the first transistor 410b may be in electrical connection with the second controlled terminal of the second transistor 412b.

For illustration as seen in FIG. 4B, the first and second NFET regions 404b and 406b may be viewed with two regions partitioned by the dotted line 418b. The first and second NFET regions 404b and 406b are continuous.

FIG. 4B serves to illustrate the different features of the integrated circuit layout cell 400b according to various embodiments, and does not limit for instance, the sizes, arrangement, orientation etc. of the different features.

The regions 402b, 404b, 406b may be formed within a substrate, e.g. a semiconductor substrate such as silicon substrate. The regions 402b, 404b, 406b may extend from a surface of the substrate to predetermined depths of the substrate.

The p-wells and the n-wells may not be easily distinguished from a microscopic image of an integrated circuit. During reverse engineering, the n-channel transistor 410b may be erroneously recognized as a p-channel transistor, while the p-channel transistor 412b may be erroneously recognized as an n-channel transistor.

Figure 4C:
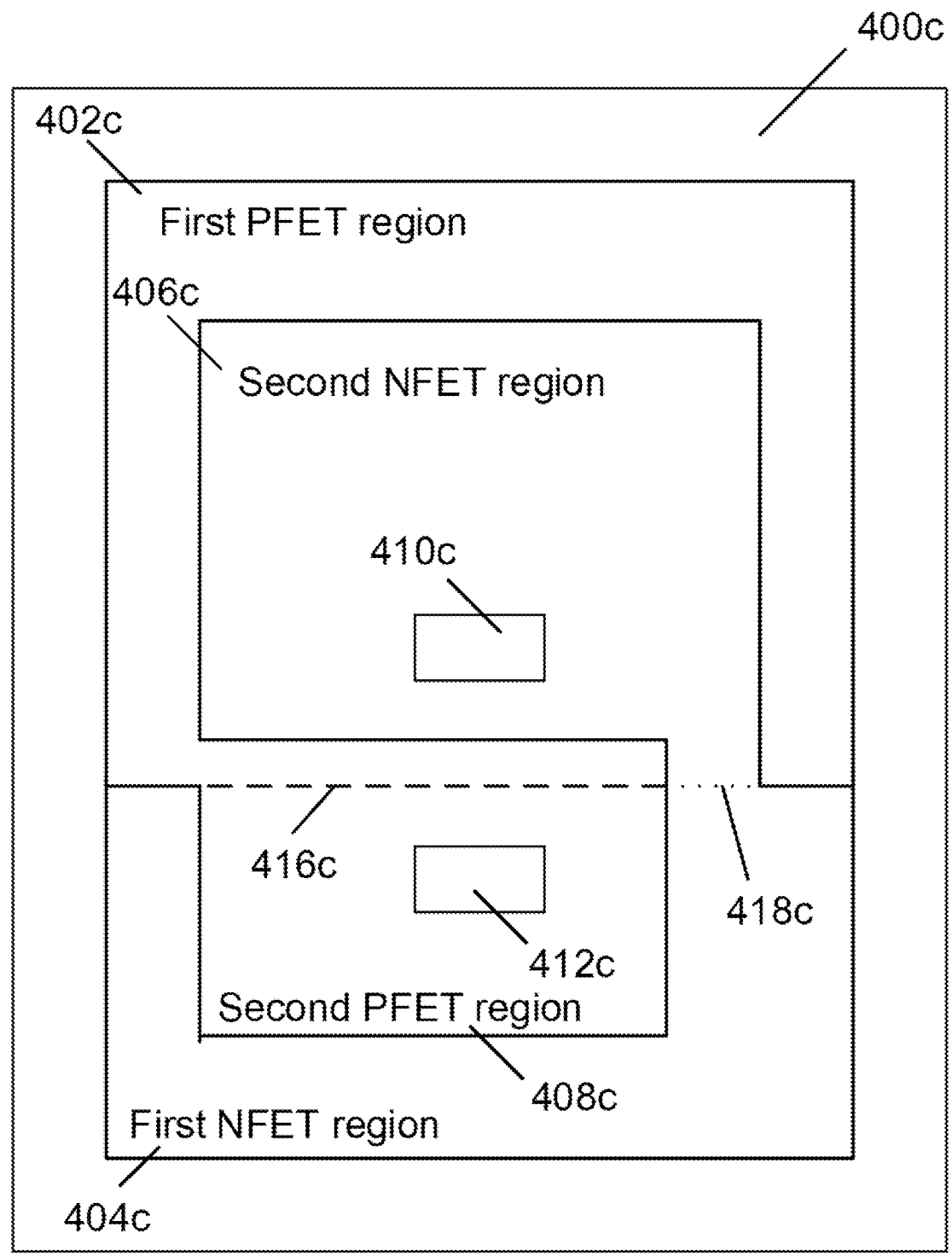
FIG. 4C is a third general illustration of an integrated circuit layout cell according to various embodiments.

FIG. 4C is a third general illustration of an integrated circuit layout cell 400c according to various embodiments.

The integrated circuit layout cell 400c may include a doped region 402c of a first conductivity type. The doped region 402c of the first conductivity type may be a first PFET region. The integrated circuit layout cell 400c may also include a doped region 404c of a second conductivity type opposite of the first conductivity type. The doped region 404c may be a first NFET region.

The integrated circuit cell 400c may additionally include a further doped region 408c of the first conductivity type, which may be at least partially within the doped region 404c of the second conductivity type, and which may be continuous with the doped region 402c of the first conductivity type. The further doped region 408c may be a second PFET region.

The integrated circuit layout cell 400c may further include a further doped region 406c of the second conductivity type which may be at least partially within the doped region 402c of the first conductivity type, and which may be continuous with the doped region 404c of the second conductivity type. The further doped region 406c may be a second NFET region.

The integrated circuit cell 400c may include a first transistor 412c having a control terminal, a first controlled terminal, and a second controlled terminal. The first controlled terminal and the second controlled terminal of the first transistor may include terminal regions of the second conductivity type formed within the further doped region 408c of the first conductivity type, i.e. the second PFET region. The first transistor 412c may be a p-channel transistor.

The integrated circuit cell 400c may also include a second transistor 410c having a control terminal, a first controlled terminal, and a second controlled terminal. The first controlled terminal and the second controlled terminal of the second transistor 410c may include terminal regions of the first conductivity type formed within the further doped region 406c of the second conductivity type, i.e. the second NFET region. The second transistor 410c may be an n-channel transistor.

The first controlled terminal of the first transistor 412c may be in electrical connection with the first controlled terminal of the second transistor 410c. The second controlled terminal of the first transistor 412c may be in electrical connection with the second controlled terminal of the second transistor 410c.

FIG. 4C serves to illustrate the different features of the integrated circuit layout cell 400b according to various embodiments, and does not limit for instance, the sizes, arrangement, orientation etc. of the different features.

The regions 402c, 404c, 406c, 408c may be formed within a substrate, e.g. a semiconductor substrate such as silicon substrate. The regions 402c, 404c, 406c, 408c may extend from a surface of the substrate to predetermined depths of the substrate.

The p-wells and the n-wells may not be easily distinguished from a microscopic image of an integrated circuit. During reverse engineering, the n-channel transistor 410c may be erroneously recognized as a p-channel transistor, while the p-channel transistor 412c may be erroneously recognized as an n-channel transistor.

The p-wells and the n-wells may not be easily distinguished from a microscopic image of an integrated circuit. In various embodiments, for each integrated circuit layout cell (400a, 400b or 400c), a size of the NMOS transistor (410a, 410b or 410c) may be equal to a size of the PMOS transistor (412a, 412b, 412c). As such, for each integrated circuit layout cell (400a, 400b or 400c) the p-channel and n-channel transistors therein may be difficult to be distinguished from each other.

For each integrated circuit layout cell (400a, 400b or 400c), the n-channel transistor (410a, 410b or 410c) and the p-channel transistor (412a, 412b, 412c) may form a transmission gate. The transmission gate may allow the n-channel transistor and the p-channel transistor to be of about the same size without significant effect on the output in the transmission gate. In contrast, in a typical circuit, a p-channel transistor may usually have to be larger than an n-channel transistor due to the higher mobility of electrons compared to holes. Consequently, the bigger-sized p-channel transistor may form a carrier channel with greater width (compared to the n-channel transistor) to compensate for the lower mobility of holes, in order to achieve the same channel resistance. The transmission gate includes an n-channel transistor and a p-channel transistor connected together in such a manner that the output would not be affected significantly even if the p-channel transistor is of the same size as the n-channel transistor.

In practice, for each integrated circuit layout cell (400a, 400b or 400c), the sizes of the transistors (410a and 412a, 410b and 412b, and 410c and 412c) may vary due to difficulties associated with fabrication of the transistors. In various embodiments, the size of transistor (410a, 410b, 410c) may be less than 20% or 10% bigger or smaller than the size of transistor (412a, 412b, 412c).

In the current context, a size of the transistor may refer to an area on the substrate occupied by the transistor, or one or more dimensions of the transistor, e.g. the width of the gate.

In various embodiments, a first circuit element "connected" to a second circuit element may refer to instances in which the first circuit element is directly in contact with the second circuit element, or instances in which the first circuit element is electrically connected to the second circuit element via one or more interconnections, and/or one or more other passive elements, such as resistors (but with no active element, e.g. a transistor, between).

In various embodiments, for each integrated circuit layout cell (400a, 400b, 400c), it may include a first power metal line. The integrated circuit layout cell (400a, 400b, 400c) may also include a second power metal line. The first power line and/or the second power line may be on or over the substrate.

In various embodiments, for each integrated circuit layout cell (400a, 400b, 400c), the first power metal line may be nearer to the first PFET region (402a, 402b, 402c) than to the first NFET region (404a, 404b, 404c). The first power metal line may be connected or configured to connect to a power supply. The power supply may be at a non-zero voltage, i.e. VDD. In various embodiments, the second power metal line may be nearer to the first NFET region (404a, 404b, 404c) than to the first PFET region (402a, 402b, 402c). The second power metal line may be connected or configured to connect to ground, i.e. at about 0 V.

In various embodiments, the first controlled terminal may refer to the drain, while the second controlled terminal may refer to the source. In various other embodiments, the first controlled terminal may refer to the source, while the second controlled terminal may refer to the drain. The control terminal may refer to the gate.

In various embodiments, each integrated circuit layout cell (400a, 400b, or 400c) may include more than one n-channel transistors collectively formed on the first and/or second NFET region(s) (e.g. 404a, 404b and/or 406b, and 404c and/or 406c). Each of the more than one n-channel transistors may have a control terminal, a first controlled terminal, and a second controlled terminal. Each integrated circuit layout cell (400a, 400b, or 400c) may include more than one p-channel transistors collectively formed on the first and/or second PFET region(s) (402a and/or 408a, 412b, and 402*c* and/or 408*c*). Each of the more than one p-channel transistors may have a control terminal, a first controlled terminal, and a second controlled terminal.

A total number of n-channel transistors may be equal to a total number of p-channel transistors.

More than one n-channel transistors and more than one p-channel transistors may form more than one transmission gates.

The first controlled terminal of a respective n-channel transistor of the more than one n-channel transistors may be connected or in electrical connection with the first controlled terminal of a respective p-channel transistor of the more than one p-channel transistors. The second controlled terminal of the respective n-channel transistor of the more than one n-channel transistors may be connected or in electrical connection with the second controlled terminal of the respective p-channel transistor of the more than one p-channel transistors.

Figure 4D:
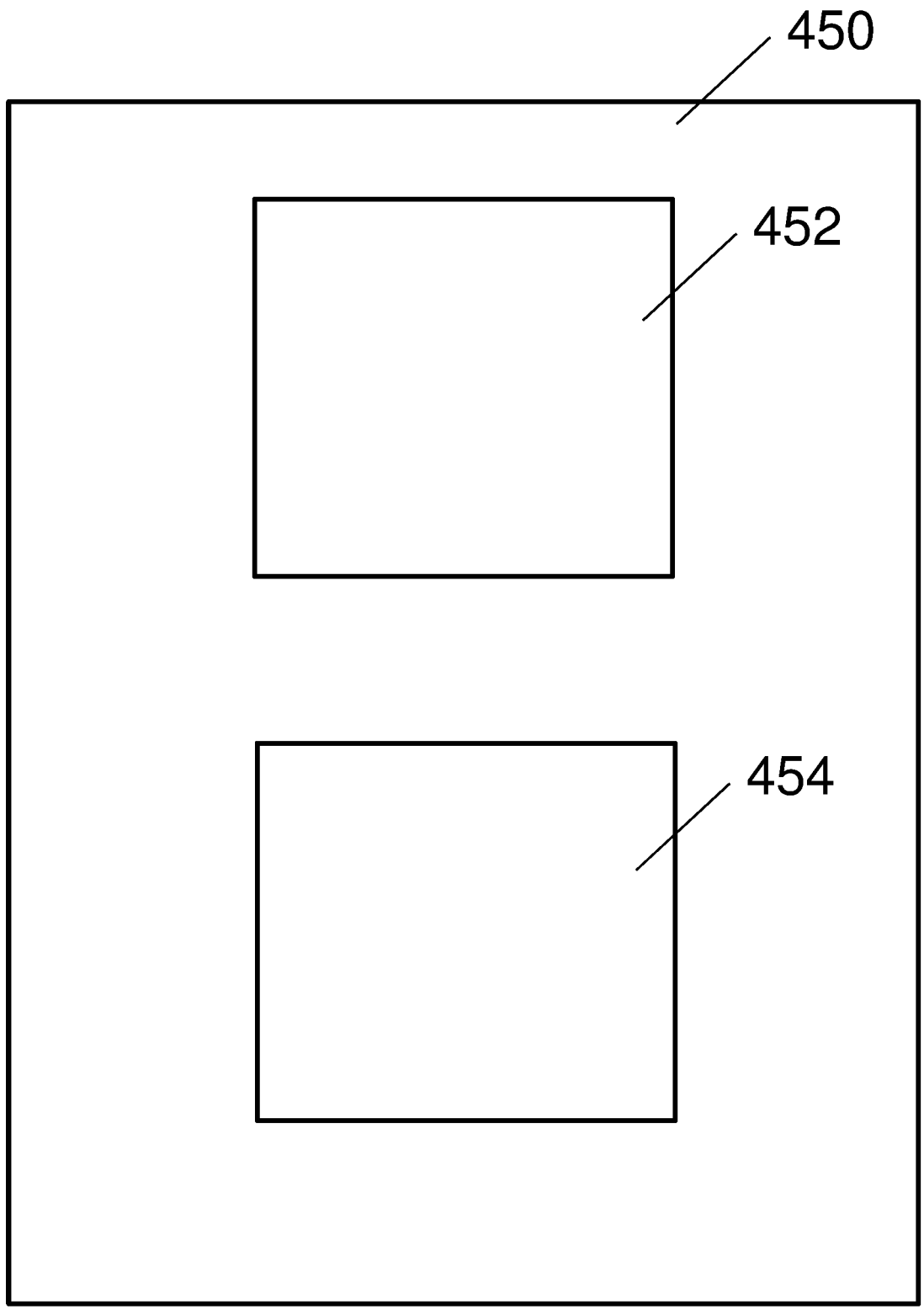
FIG. 4D is a general illustration of an integrated circuit layout arrangement according to various embodiments.

FIG. 4D is a general illustration of an integrated circuit layout arrangement 450 according to various embodiments. The integrated circuit layout arrangement 450 may include a first integrated circuit layout cell 452. The integrated circuit layout arrangement 450 may also include a second integrated circuit layout cell 454.

The first integrated circuit layout cell 452 may be the cell 400*a* shown in FIG. 4A, the cell 400*b* shown in FIG. 4B or the cell 400*c* shown in FIG. 4C.

The second integrated circuit layout cell 454 may include a further p-channel transistor and a further n-channel transistor. The further p-channel transistor may include a control terminal, a first controlled terminal, and a second controlled terminal. The further p-channel transistor may include a control terminal, a first controlled terminal, and a second controlled terminal. The first controlled terminal of the further p-channel transistor may be connected or in electrical connection with the first controlled terminal of the further n-channel transistor. The second controlled terminal of the further p-channel transistor may be connected or in electrical connection with the second controlled terminal of the further n-channel transistor.

Figure 4E:
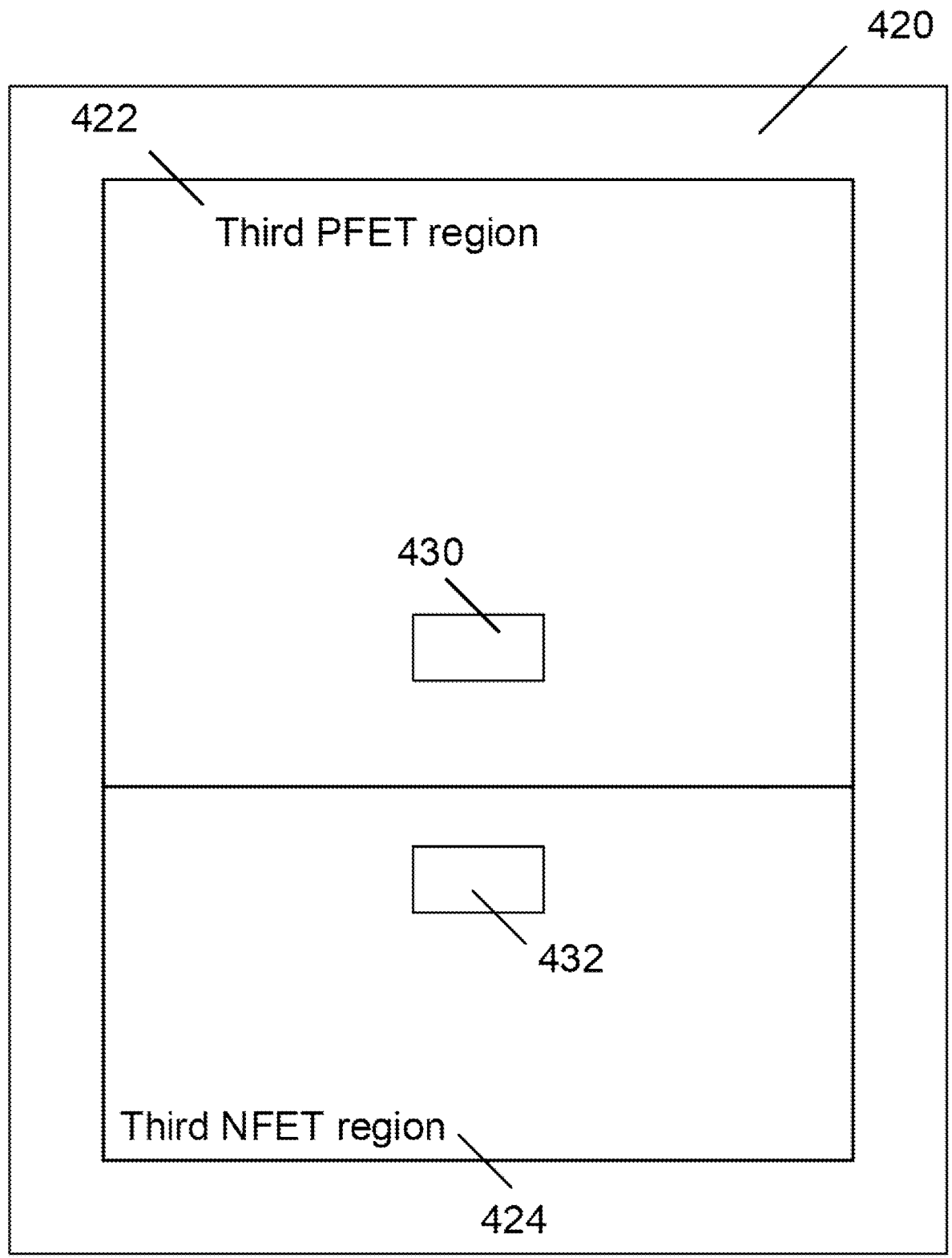
FIG. 4E is a general illustration of an integrated circuit layout cell according to various embodiments.

FIG. 4E is a general illustration of an integrated circuit layout cell 420 according to various embodiments.

FIGS. 4A-E also serve to illustrate the different features of the integrated circuit layout arrangement 450 or cells 400*a-c*, 420 according to various embodiments, and do not limit for instance, the sizes, arrangement, orientation etc. of the different features.

In various embodiments, the second integrated circuit layout cell 454 shown in FIG. 4D may be the integrated circuit layout cell 420 shown in FIG. 4E.

In various embodiments, the second integrated circuit layout cell 420 may include a third PFET region 422. The second integrated circuit layout cell 420 may also include a third NFET region 424.

As highlighted above, the second integrated layout cell 454, 420 may include a further p-channel transistor 430 and a further n-channel transistor 432.

The further p-channel transistor 430 may be formed on the third PFET region 422. The further n-channel transistor 432 may be formed on the third NFET region 424.

The layout of the cell 420 shown in FIG. 4E may be difficult to be distinguished from the layout of the cell 400*c* shown in FIG. 4C. As such, by employing a mixture of cells 400*c*, 420 in a device or arrangement, it may be more difficult to reverse engineer the device or arrangement. Cells 400*c* and 420 may also be alternate versions of a camouflage cell. In other words, by looking at the layout of the camouflage cell, it may be difficult to tell whether the camouflage cell is actually cell 400*c* or cell 420.

In various embodiment, the third PFET region 422 may be at least partially within the third NFET region 424—this layout arrangement may be similarly to that shown in FIG. 4A. In this case, the layout of the cell 420 shown in FIG. 4E may be difficult to be distinguished from the layout of the cell 400*a* shown in FIG. 4A. As such, by employing a mixture of cells 400*a*, 420 in a device or arrangement, it may be more difficult to reverse engineer the device or arrangement. Cells 400*a* and 420 may also be alternate versions of a camouflage cell. In other words, by looking at the layout of the camouflage cell, it may be difficult to tell whether the camouflage cell is actually cell 400*a* or cell 420.

In various embodiment, the third NFET region 422 may be at least partially within the third PFET region 424—this layout arrangement may be similarly to that shown in FIG. 4B. In this case, the layout of the cell 420 shown in FIG. 4E may be difficult to be distinguished from the layout of the cell 400*b* shown in FIG. 4B. As such, by employing a mixture of cells 400*b*, 420 in a device or arrangement, it may be more difficult to reverse engineer the device or arrangement. Cells 400*b* and 420 may also be alternate versions of a camouflage cell. In other words, by looking at the layout of the camouflage cell, it may be difficult to tell whether the camouflage cell is actually cell 400*b* or cell 420.

In various embodiment, the third NFET region 422 may be at least partially within a fourth PFET region, and the third PFET region 424 may be at least partially within a fourth NFET region—this layout arrangement may be similarly to that shown in FIG. 4C. In this case, the layout of the cell 420 shown in FIG. 4E may be difficult to be distinguished from the layout of the cell 400*c* shown in FIG. 4C. As such, by employing a mixture of cells 400*c*, 420 in a device or arrangement, it may be more difficult to reverse engineer the device or arrangement. Cells 400*c* and 420 may also be alternate versions of a camouflage cell. In other words, by looking at the layout of the camouflage cell, it may be difficult to tell whether the camouflage cell is actually cell 400*c* or cell 420.

The substrates of the first PFET region (of cell 400*a*, 400*b*, 400*c*, 452) and of the third PFET region (of cell 420, 454) may be electrically connected. The substrates of the first NFET region (of cell 400*a*, 400*b*, 400*c*, 452) and of the third NFET region (of cell 420, 454) may be electrically connected.

In various embodiments, the first PFET region (of cell 400*a*, 400*b*, 400*c*, 452) may adjoin the third PFET region (of cell 420, 454). The first NFET region (of cell 400*a*, 400*b*, 400*c*, 452) may adjoin the third NFET region (of cell 420, 454).

In various embodiments, a size of the further n-channel transistor 432 may be equal to a size of the further p-channel transistor 430. In various embodiments, the size of further p-channel transistor 430 may be less than 20% or 10% bigger or smaller than the size of further n-channel transistor 432.

In various embodiments, the second integrated circuit layout cell 420 may include more than one further n-channel transistors formed on the third n-channel region 424. Each of the more than one further n-channel transistors may have a control terminal, a first controlled terminal, and a second controlled terminal. The second integrated circuit layout cell 420 may include more than one further p-channel transistors formed on the third PFET region 422. Each of the more than one further p-channel transistors may have a control terminal, a first controlled terminal, and a second controlled terminal.

A total number of further n-channel transistors may be equal to a total number of further p-channel transistors. More than one further n-channel transistors and more than one further p-channel transistors may form more than one transmission gates.

In various embodiments, the second integrated circuit layout cell 454 shown in FIG. 4E may be a further cell 400*a* shown in FIG. 4A, a further cell 400*b* shown in FIG. 4B, or a further cell 400*c* shown in FIG. 4C. In other words, in various embodiments, the first integrated circuit layout cell 452 may be a first cell 400*a* as shown in FIG. 4A, a first cell 400*b* as shown in FIG. 4B, a first cell 400*c* as shown in FIG. 4C. The second integrated layout cell 454 may be a second cell 400*a* as shown in FIG. 4A, a second cell 400*b* as shown in FIG. 4B, a second cell 400*c* as shown in FIG. 4C, or a second cell 420 as shown in FIG. 4E.

The arrangement 450 may include two cells 420. In other words, cell 452 may be a first cell 420, and cell 454 may be a second cell 420.

In various embodiments, the control terminal of the p-channel transistor (of cell 452) may be connected to the control terminal of the further n-channel transistor (of cell 454). In various embodiments, the control terminal of the n-channel transistor (of cell 452) may be connected to the control terminal of the further p-channel transistor (of cell 454).

In various embodiments, the control terminal of the p-channel transistor (of cell 452) and the control terminal of the further n-channel transistor (of cell 454) may be configured to receive a first input signal. The control terminal of the n-channel transistor (of cell 452) and the control terminal of the further p-channel transistor (of cell 454) may be configured to receive a second input signal. The second input signal may be complementary to the first input signal.

The integrated circuit layout arrangement 450 may include an input inverter to generate the second input signal based on the first input signal. The input of the input inverter may be configured to receive the first input signal, and the output of the input inverter may be connected or in electrical connection to the control terminal of the n-channel transistor (of cell 452) and the control terminal of the further p-channel transistor (of cell 454).

The integrated circuit layout arrangement 450 may be configured to realize a logical function based on a third input signal provided to the first controlled terminal of the p-channel transistor (of cell 452) and the first controlled terminal of the n-channel transistor (of cell 452), and a fourth input signal provided to the first controlled terminal of the further p-channel transistor (of cell 454) and the first controlled terminal of the further n-channel transistor (of cell 454).

The integrated circuit layout arrangement 450 may further include an (output) inverter having an input and an output. The input of the (output) inverter may be connected to the second controlled terminal of the n-channel transistor (of cell 452), the second controlled terminal of the p-channel transistor (of cell 454), the second controlled terminal of the further p-channel transistor (of cell 452), and the second controlled terminal of the further n-channel transistor (of cell 454).

In various embodiments, the integrated circuit layout arrangement 450 may additionally include a first power metal line. The integrated circuit layout arrangement 450 may also include a second power metal line.

The first power metal line may be nearer to the first PFET region (of cell 452) than to the first NFET region (of cell 452). In various embodiments, the first power metal line may extend through cell 452 and cell 454, and the second power metal line may extend through cell 452 and cell 454.

Conversely, the second power metal line may be nearer to the first NFET region (of cell 452) than to the first PFET region (of cell 452).

In various embodiments, the first power metal line may be connected to the first controlled terminal of the p-channel transistor (of cell 452) and the first controlled terminal of the n-channel transistor (of cell 452) to provide the third input signal.

In various embodiments, the second power metal line may be connected to the first controlled terminal of the p-channel transistor (of cell 452) and the first controlled terminal of the n-channel transistor (of cell 452) to provide the third input signal.

In various embodiments, the first power metal line may be connected to the first controlled terminal of the further p-channel transistor (of cell 454) and the first controlled terminal of the further n-channel transistor (of cell 454) to provide the fourth input signal.

In various embodiments, the second power metal line may be connected to the first controlled terminal of the further p-channel transistor (of cell 454) and the first controlled terminal of the further n-channel transistor (of cell 454) to provide the fourth input signal.

In various embodiments, the first power metal line may be connected or configured to connect to a power supply. The second power metal line may be connected or configured to connect to ground.

Various embodiments may provide a device including one or more integrated circuit layout arrangements. The one or more integrated circuit layout arrangements may include one or more arrangements 450 shown in FIG. 4D (arrangement including two cells 400*a*, and/or arrangement including cell 400*a* and 400*b*, and/or arrangement including cell 400*a* and 400*c*, and/or including cell 400*a* and cell 420, and/or arrangement including two cells 400*b*, and/or arrangement including cell 400*b* and 400*c*, and/or arrangement including cell 400*b* and 420, and/or arrangement including two cells 400*c*, and/or arrangement including cell 400*c* and 420). Different arrangements may provide different logic functions based on the same inputs. In addition, different inputs applied to a particular arrangement may also provide different logic functions.

In various embodiments, as it is difficult to distinguish between the NFET regions and the PFET regions, and as equal numbers of p-channel transistors and n-channel transistors are arranged in transmission gate pairs and of about the same sizes, it may be difficult for a third party to reverse engineer a device including the circuit layout arrangements.

Figure 5:
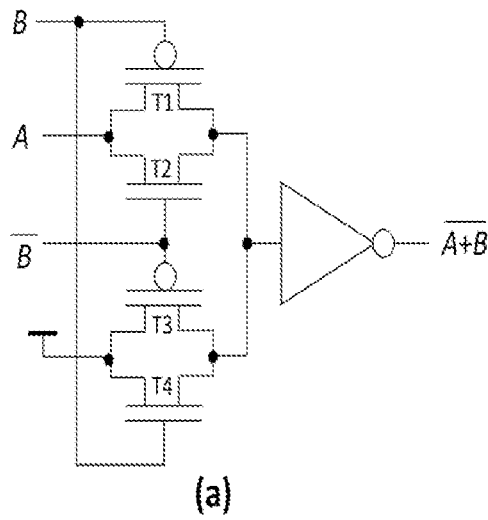
FIG. 5 shows (a) a 2-input NOR gate, (b) a 2-input AND gate, (c) a 2-input OR gate, (d) a 2-input NAND gate, (e) a 2-input XOR gate, and (f) a 2-input XNOR gate.
Figure 5:
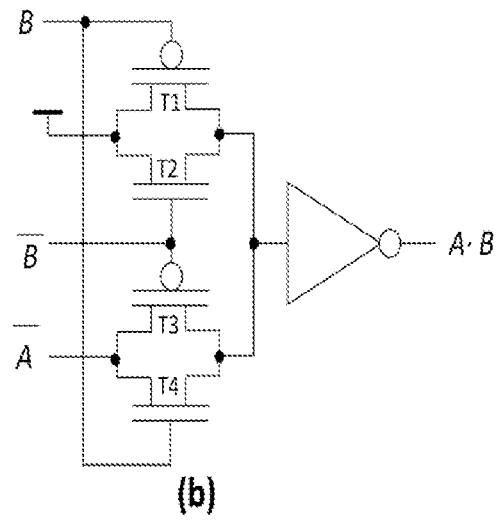
Figure 5:
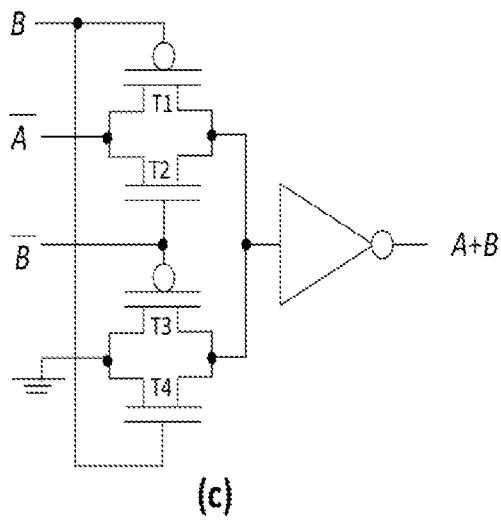
Figure 5:
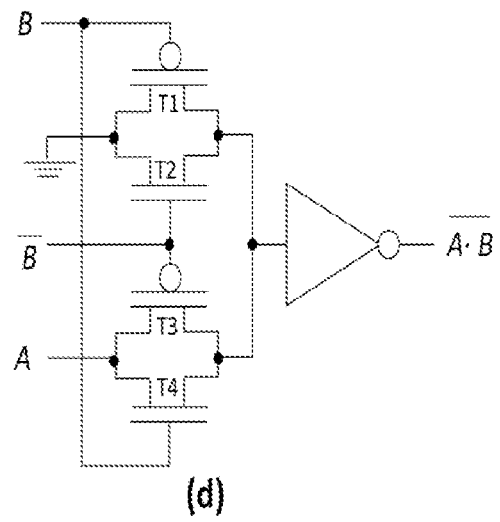
Figure 5:
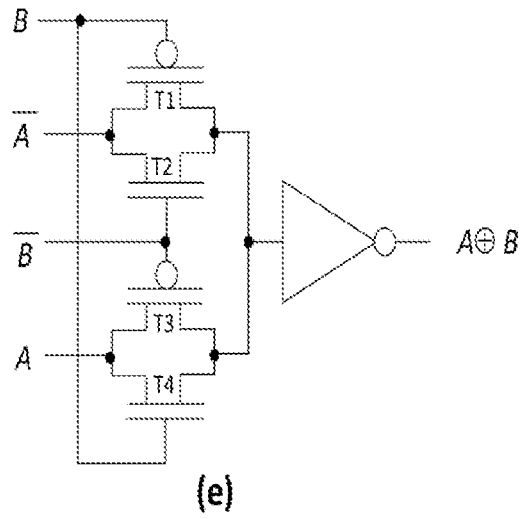
Figure 5:
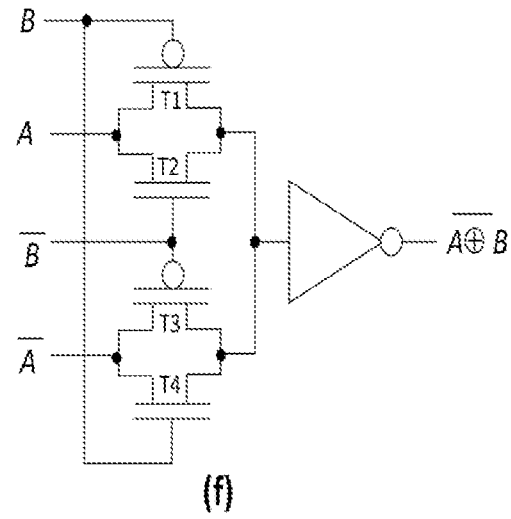

FIG. 5 shows (a) a 2-input NOR gate, (b) a 2-input AND gate, (c) a 2-input OR gate, (d) a 2-input NAND gate, (e) a 2-input XOR gate, and (f) a 2-input XNOR gate. The designs in FIG. 5 may be transmission-gate based designs, with each circuit arrangement having 2 p-channel transistors (T1 and T3) and 2 n-channel transistors (T2 and T4). The output inverter or inverting buffer shown in FIG. 5 may be optional.

The transistor designs or circuit arrangements shown in FIG. 5(*a*)-(*f*) may be identical. However, the inputs provided to drive each circuit arrangement may be different in order to realize different logic functions.

From the layout viewpoints, the designs may be floor-planned to be almost identical expect for some metal layers to drive the inputs (i.e. drain of the transistors). For example, the 2-input NOR gate (shown in FIG. 5(a)) has the VDD metal (i.e. power metal line connected to VDD) connected to the drains of transistors T3 and T4. Similarly, the 2-input AND gate (shown in FIG. 5(b)) has the VDD metal connected to the drains of transistors T1 and T2.

Figure 6A:
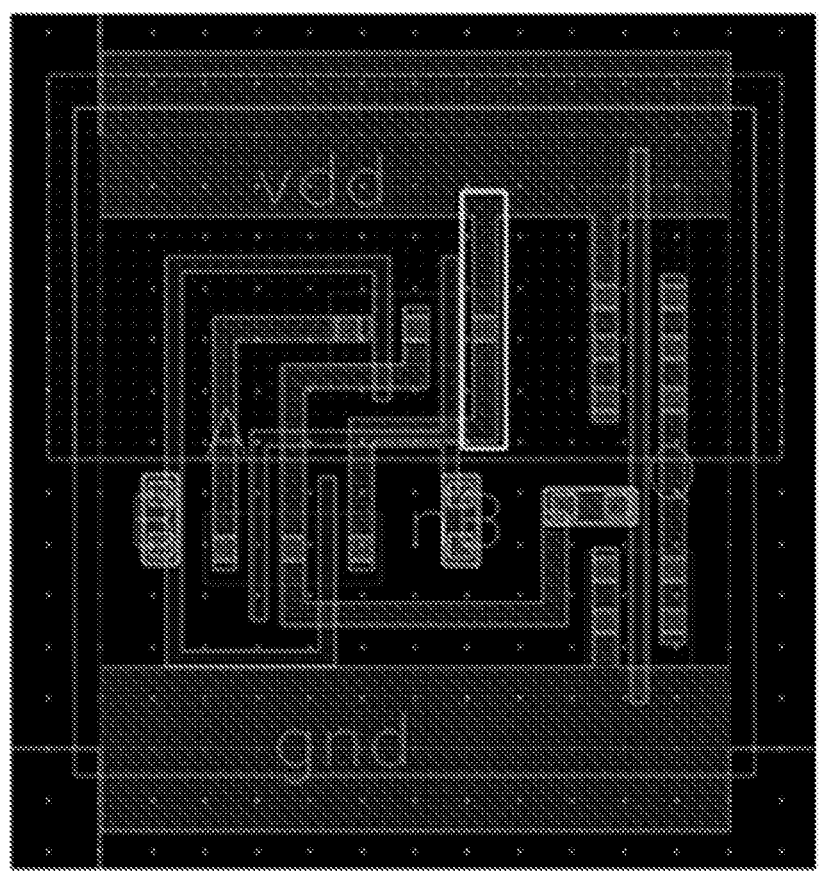
FIG. 6A shows the layout of the 2-input NOR gate.
Figure 6B:
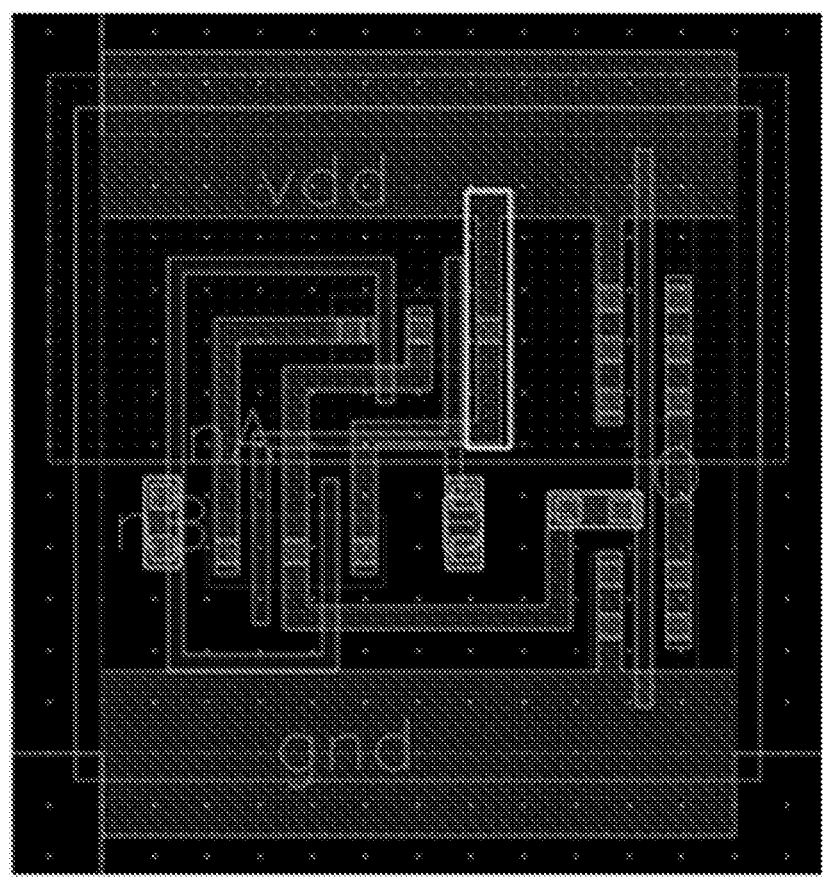
FIG. 6B shows the layout of the 2-input AND gate.

FIG. 6A shows the layout of the 2-input NOR gate. FIG. 6B shows the layout of the 2-input AND gate. The layout shown in FIG. 6A and the layout shown in FIG. 6B are the same. However, the different inputs applied may results in different functions.

By tracing the VDD metal layers (white boxes in FIGS. 6A-B), it may be deduced that the layout shown in FIG. 6A or the layout shown in FIG. 6B may either be the 2-input NOR gate or the 2-input AND gate (from other designs shown in FIG. 5(c)-(f)).

Figure 6C:
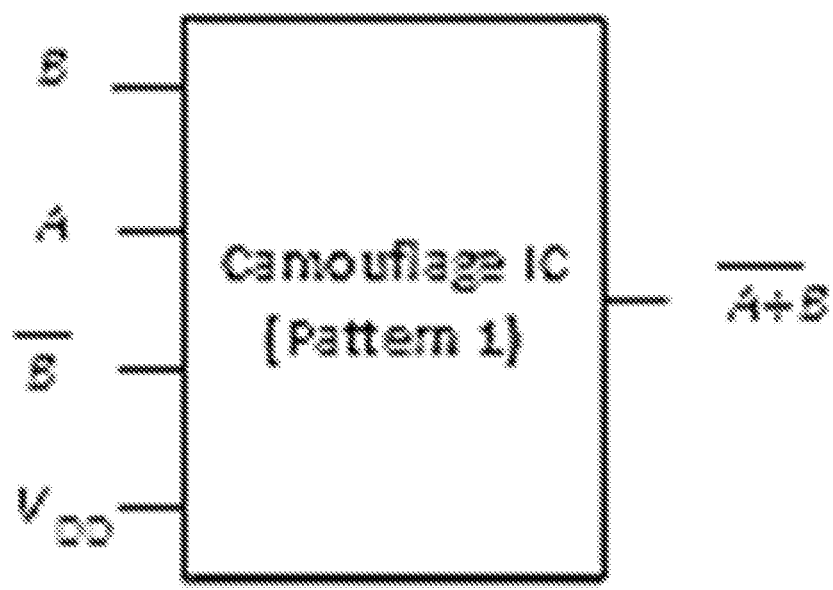
FIG. 6C is a schematic illustrating the input configuration of the NOR gate shown in FIG. 6A.
Figure 6D:
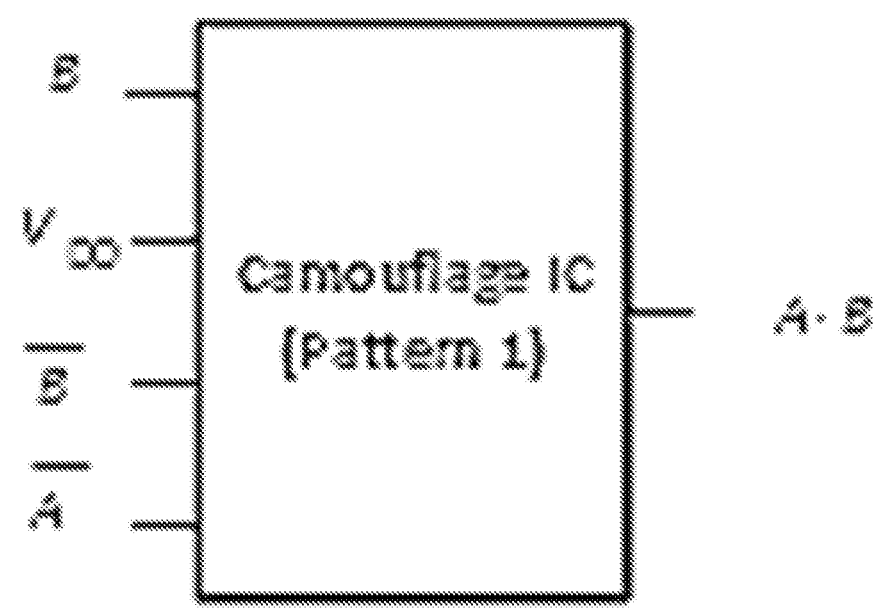
FIG. 6D is a schematic illustrating the input configuration of the AND gate shown in FIG. 6B.

FIG. 6C is a schematic illustrating the input configuration of the NOR gate shown in FIG. 6A. FIG. 6D is a schematic illustrating the input configuration of the AND gate shown in FIG. 6B.

The limitation is that the extracted transistor netlist may still be deduced correctly when the reverse engineering efforts to match/guess the input configurations are based on various input combinations and/or other analysis algorithm. This limitation has been discussed earlier where conventional techniques adopt a programmable means to configure various logical functions, or adopt a register-based means to configure various logical functions. As long as the netlist is accurately extracted, the brute-force input-output matching (with data analysis techniques) may still be able to identify the cells.

The same issue and associated limitations may apply to the 2-input OR gate (shown in FIG. 5(c)) and the 2-input NAND gate (shown in FIG. 5(d)) where the GND metals (i.e. metal lines connected to ground) may possibly expose their identities. Similarly, for the 2-input XOR gate (shown in FIG. 5(e)) and 2-input XNOR gate (shown in FIG. 5(f)), having neither VDD metals nor GND metals connected to drains of the transistors may also possibly expose their identities.

Figure 7A:
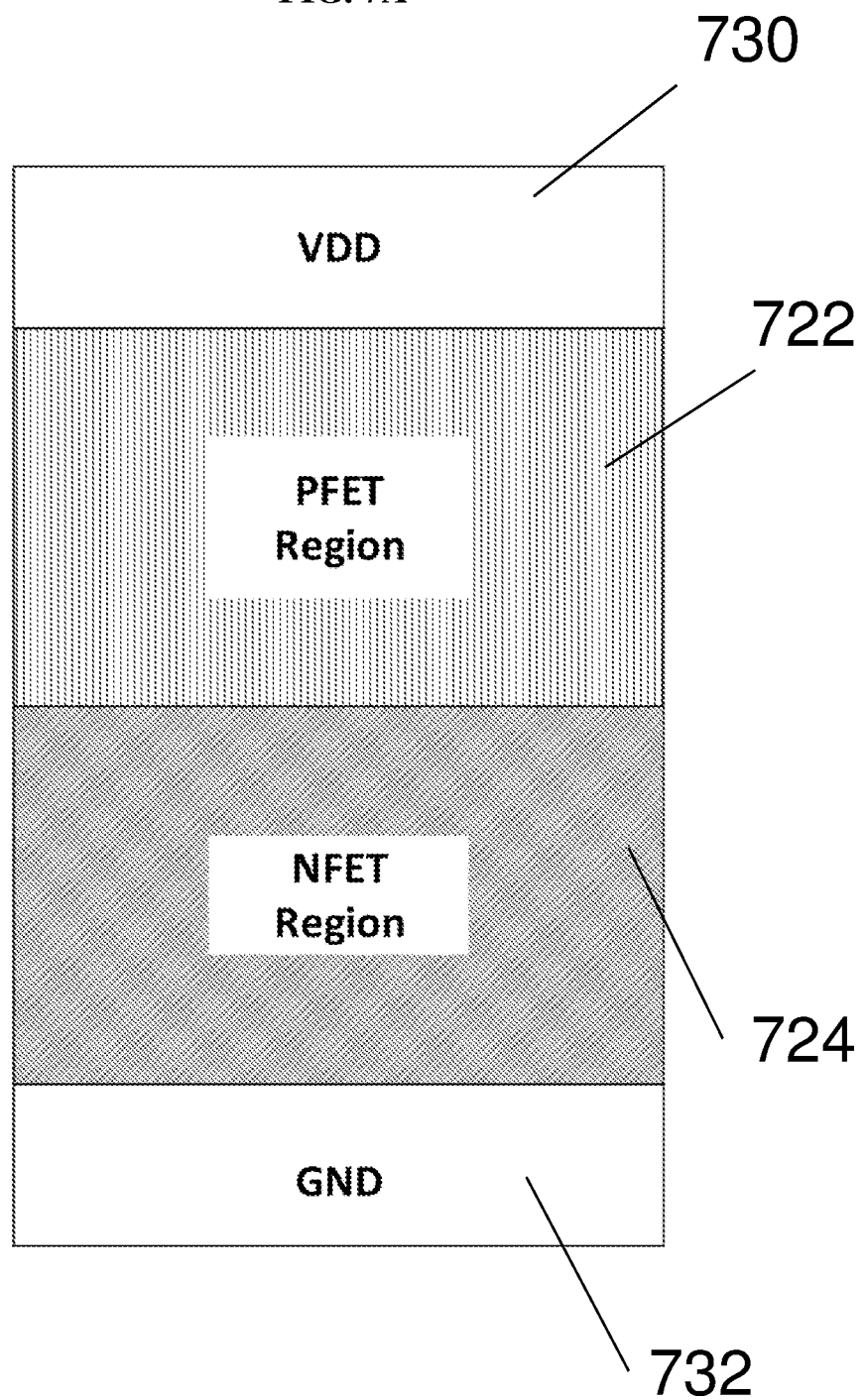
FIG. 7A is a schematic showing a top planar view of a standard layout template.

FIG. 7A is a schematic showing a top planar view of a standard layout template. The layout may include a VDD power metal layer 730 at the top, and a GND power metal layer 732 at the bottom. The PFET region 722 (i.e. n-well), where p-channel transistors are placed within, may be at the upper part, near the $V_{DD}$ power metal layer 730. The NFET region 724 (e.g. i.e. p-substrate or p-well), where n-channel transistors are placed within, is at the lower part, near the GND power metal layer 732.

Figure 7B:
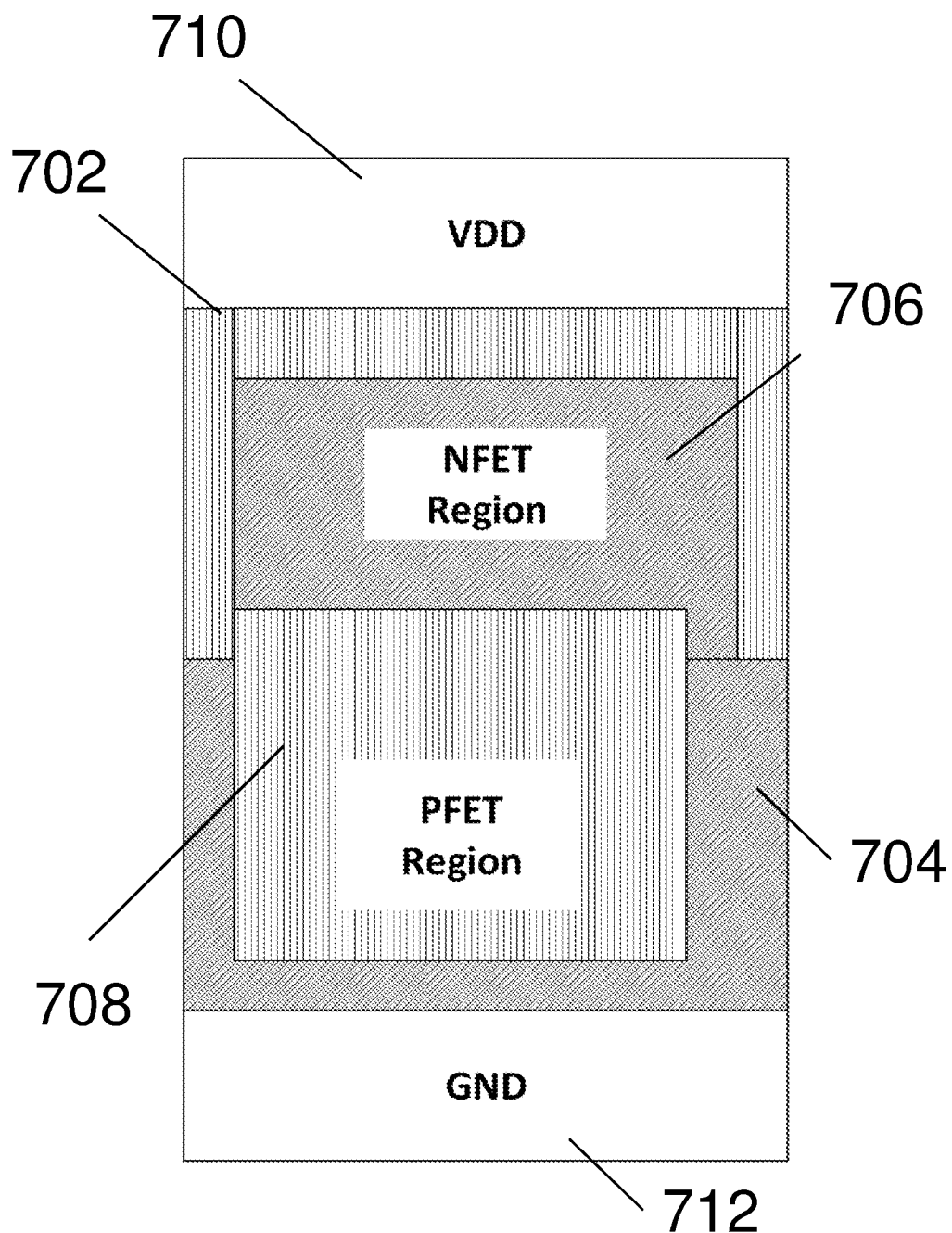
FIG. 7B is a schematic showing a top planar view of a layout template according to various embodiments.

FIG. 7B is a schematic showing a top planar view of a layout template according to various embodiments. The main PFET region 708 may be at the bottom, near the GND power metal layer 712. The main NFET region 706 may be at the top, near the $V_{DD}$ power metal layer 710. The $V_{DD}$ power metal layer 710 may be or may extend from the $V_{DD}$ power metal layer 730 in FIG. 7A. The GND power metal layer 712 in FIG. 7B may be or may extend from the GND power metal layer 732 in FIG. 7A.

In order to make the layout template shown in FIG. 7B compatible with the standard layout template shown in FIG. 7A, the PFET region 702 may be continuous with or adjoining PFET region 722, and may remain Design-Rule-Check-free (DRC-free) when the proposed template and the standard template are abutted together. Similarly, the NFET region 704 may be continuous with or adjoining NFET region 728, and may remain DRC-free when the proposed template and the standard template are abutted together.

By interchanging the PFET region and the NFET region, different logical functions may be generated.

Figure 8A:
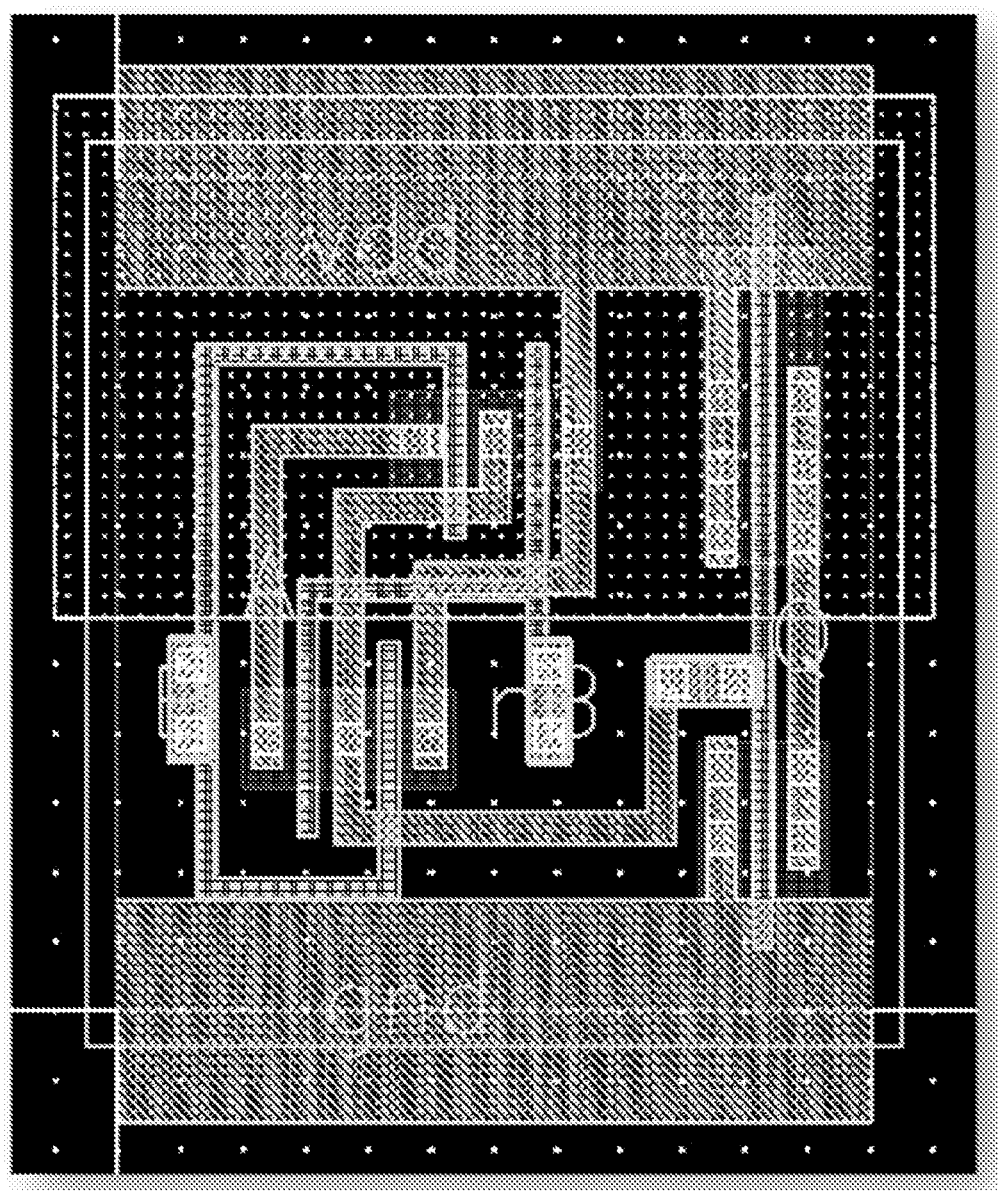
FIG. 8A is a cell layout corresponding to the standard layout template shown in FIG. 7A.
Figure 8B:
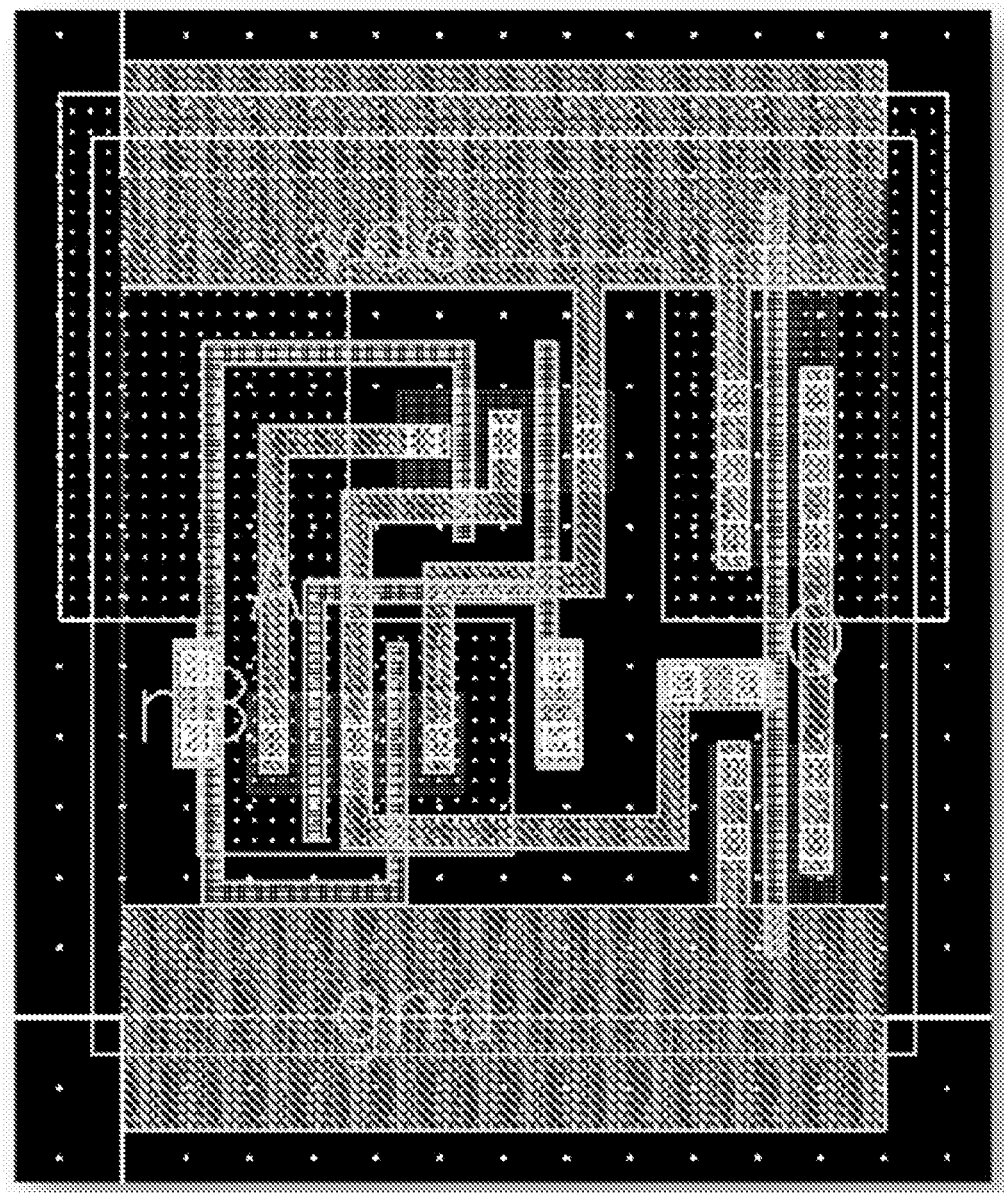
FIG. 8B is a cell layout corresponding to the layout template shown in FIG. 7B according to various embodiments.

FIG. 8A is a cell layout corresponding to the standard layout template shown in FIG. 7A. FIG. 8B is a cell layout corresponding to the layout template shown in FIG. 7B according to various embodiments. The layouts shown in FIGS. 8A-B may appear to be the same, but may have different logical functions. The cell layout shown in FIG. 8A may have the logical function AND, while the cell layout shown in FIG. 8B may have the logical function NOR. The logical functions of the cell layouts shown in FIGS. 8A-B may be different although the inputs are the same, due to the interchanging of the PFET region and the NFET region as illustrated in FIGS. 7A-B.

Various embodiments may involve intermixing the layouts of the standard template and the proposed template. In other words, one camouflage IC layout view can lead to many different possible functions depending on the input configurations and the PFET/NFET regions placement.

Figure 9A:
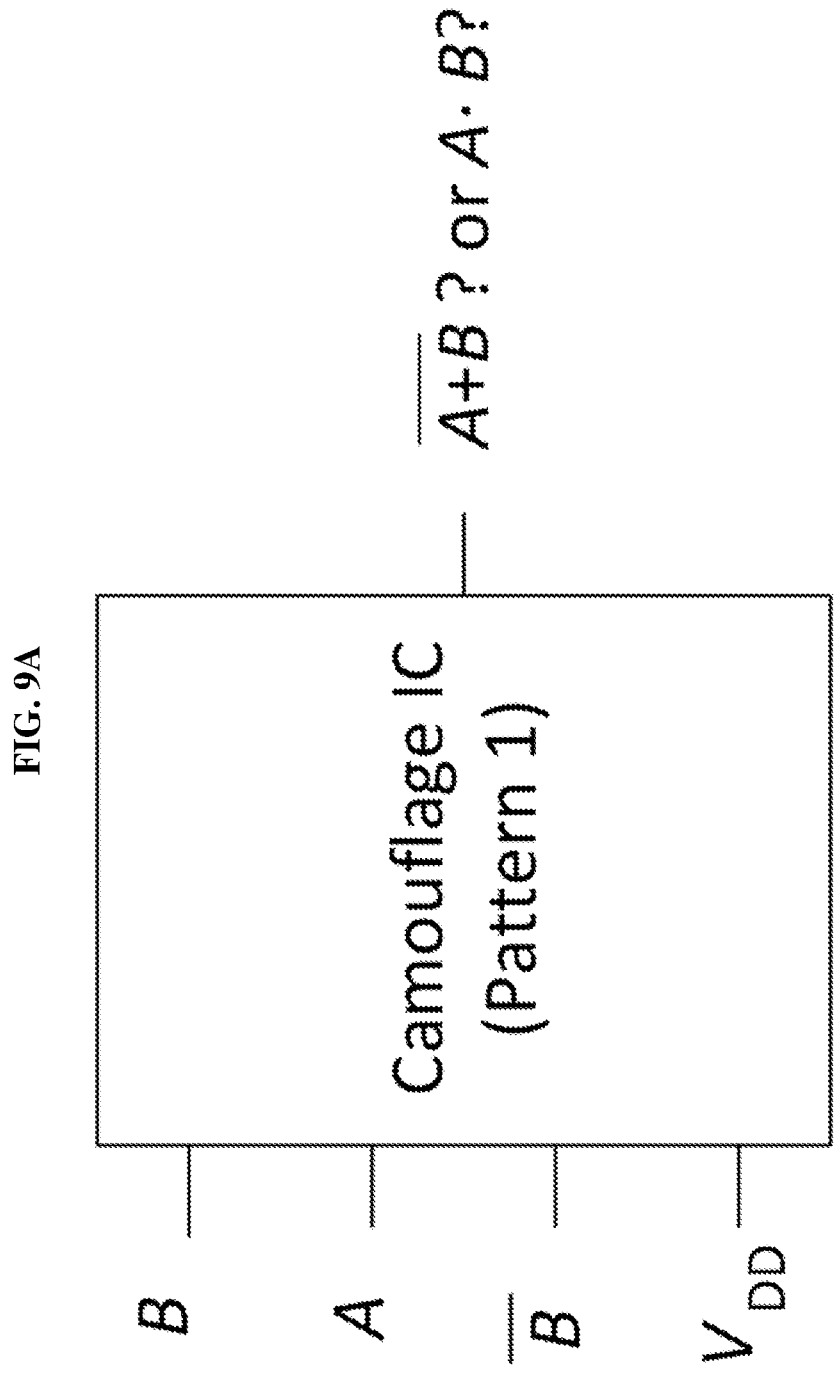
FIG. 9A is a schematic illustrating the inputs and possible outputs of a camouflage cell according to various embodiments.
Figure 9B:
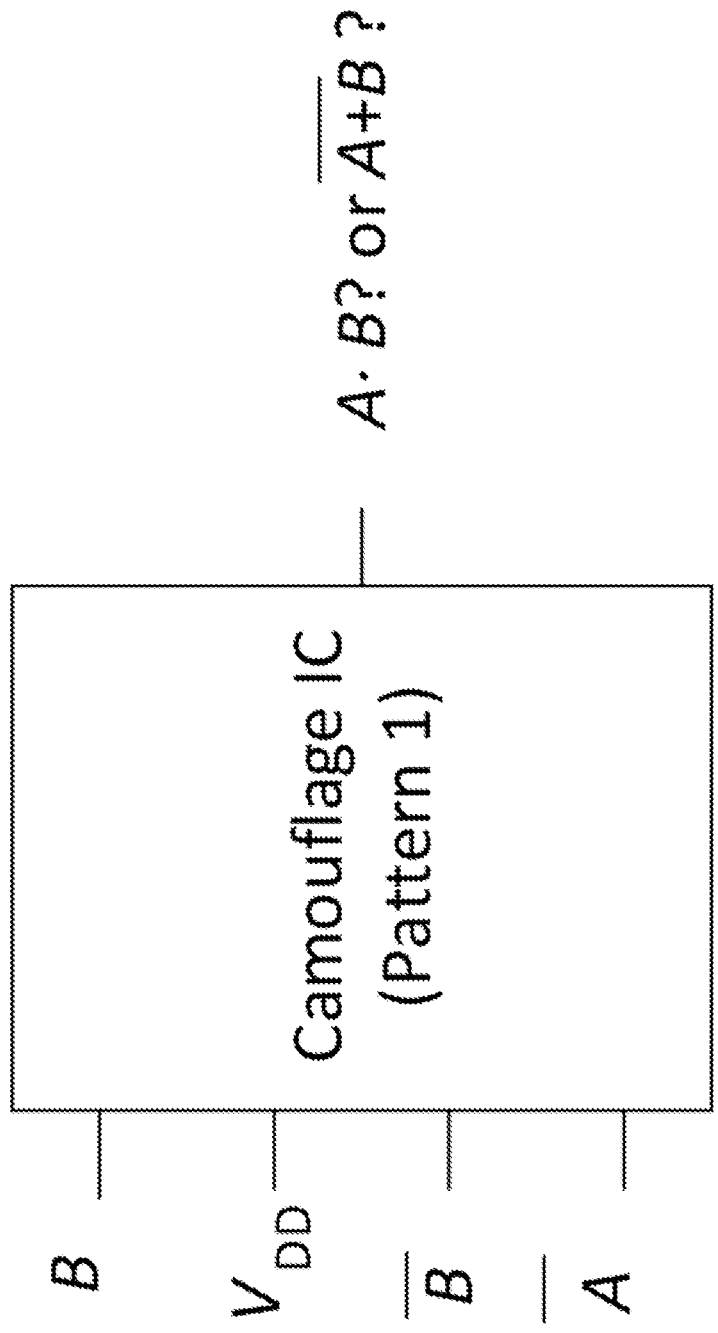
FIG. 9B is a schematic illustrating the inputs and possible outputs of another camouflage cell according to various embodiments.

FIG. 9A is a schematic illustrating the inputs and possible outputs of a camouflage cell according to various embodiments. FIG. 9B is a schematic illustrating the inputs and possible outputs of another camouflage cell according to various embodiments.

FIG. 9A may correspond to the same input configuration as provided to the NOR gate as illustrated in FIG. 6C, while FIG. 9B corresponds to the same input configuration as provided to the AND gate as shown in FIG. 6D. However, the camouflage cell in FIG. 9A may either provide a NOR logical function or a AND logical function with the input configuration, instead of just the NOR logical function as shown in FIG. 6C. Similarly, the camouflage cell in FIG. 9B may either provide a AND logical function or a NOR logical function with the input configuration, instead of just the AND logical function as shown in FIG. 6D.

Comparing FIG. 9A and FIG. 9B, different input configurations may or may not lead to different logical functions. By intermixing the standard template and the proposed template, it may be almost impossible to extract the correct transistor netlist (possibly containing 10,000s to 100,000s of cells for a small-to-medium size design). Should the transistor netlist not be extracted correctly, the subsequent reverse engineering analysis may also be highly difficult and challenging. A possible technique to reverse engineer a device with camouflaged cells as described herein may be when the adversary de-layers and distinguishes the PFET region and the NFET region for every gate. Nonetheless, such practice may be highly costly, and the reverse engineering process may be significantly lengthy.

With reference to FIG. 5, a 2-input NOR gate and a 2-input AND gate may share the same layout view. In other words, an integrated circuit layout arrangement with a predetermined input configuration may provide the NOR logical function or the AND logical function, as illustrated in FIGS. 9A-B, depending on the arrangement of the NFET region and the PFET regions in the cells.

Similarly, a 2-input OR gate and a 2-input NAND gate may share the same layout view. A 2-input XOR gate and a 2-input XNOR gate may share the same layout view.

Based on the standard template and the proposed template, each layout view may now have 2 possible logical functions based on 4 possible netlist interpretations. Therefore, the combination for an N-gate netlist is 2N (based on the logical functions) or 4N (based on the netlist interpretations). Putting it succinctly, a 10-gate netlist may have 1024 combinations for the former and 1,048,576 combinations for the latter. A 100-gate netlist may have $1.26 \times 10^{30}$ for the former and $1.6 \times 10^{60}$ combinations for the latter. For example, even if a high-end computer which can process 1000 billion combinations per second is used to match the netlist, it may take the computer more than billion years to match the netlist. In other words, it may be extremely difficult for an adversary to extract a correct netlist, not to mention the netlist analysis may not be possible to be carried out.

Table II tabulates several figures-of-merit (FOMs) when comparing the camouflage IC against the prior-art techniques. The FOMs include reverse engineering (RE) resistance, fabrication cost, area overheads, speed overheads and power overheads. For benchmarking purpose, the readings of the various techniques are normalized with respect to the standard complementary metal oxide semiconductor (CMOS) devices.

TABLE II

Comparison of camouflage IC according to various embodiments against the reported techniques

| Techniques | RE* resistance | Fabrication Cost | Area overheads | Speed overheads | Power overheads |
|---|---|---|---|---|---|
| Standard CMOS | Very low | Low | 1x | 1x | 1x |
| Threshold dependent logic | Medium | High | 2x-3x | 2.3x-7.9x | 0.4x-1.4x |
| Threshold voltage defined logic | Medium | High | 1.8x-2.6x | 1.1x-1.7x | 1x-1.1x |
| Threshold voltage defined switch | High | High | 6.3x-12.6x | 1x-2.2x | 1.4x-16.9x |
| Voltage control multiplexer | Medium | Low | 5x-7x | 2.5x-3.5x | 3x-4x |
| Programmable IC | Medium | Low | 3x-5x | 1x-2x | 0.7x-1.5x |
| Various embodiments | Very high | Low | 2x-3x | 1x-2x | 0.6x-1.3x |

*RE—reverse engineering

In terms of difficulties in reverse engineering at the Physical Synthesis stage, various embodiments may pose the most difficulties due to the identical or similar transmission-gate-based cell circuit design, and the associated swapping of PFET and NFET regions in the identical cell layouts. 6 possible logical functions, and 12 possible netlist interpretations may be hidden.

The identical cell layouts in threshold dependent logic, threshold voltage defined logic, and voltage control multiplexer etc. may only be able to hide 2 possible logic functions, and the cells may be reverse engineered or revealed by a brute force attack. The programmable IC may also be vulnerable to the since the programmable connector may be identifiable and the netlist may be extractable through the netlist analysis. Although the threshold voltage defined switch may hide 8 possible logic functions (leading to high reverse engineering difficulty), it may suffer from extremely high area overhead, i.e. 6.3x-12.6x, which may be unrealistic in present CMOS implementations.

The threshold dependent logic, the threshold voltage defined logic, and the threshold voltage defined switch may incur high fabrication costs since they apply different options of threshold voltages in one single cell layout. These reported techniques may require careful characterization on the process. In contrast, the rest of the techniques, i.e. voltage control multiplexer, programmable IC, together with various embodiments as described herein, may have similar fabrication costs, since they are all scalable to the standard CMOS process. Nonetheless, compared to voltage control multiplexer and programmable IC, various embodiments may feature the lowest area, speeds, and power overheads.

Library cells according to various embodiments may be implemented.

Figure 10A:
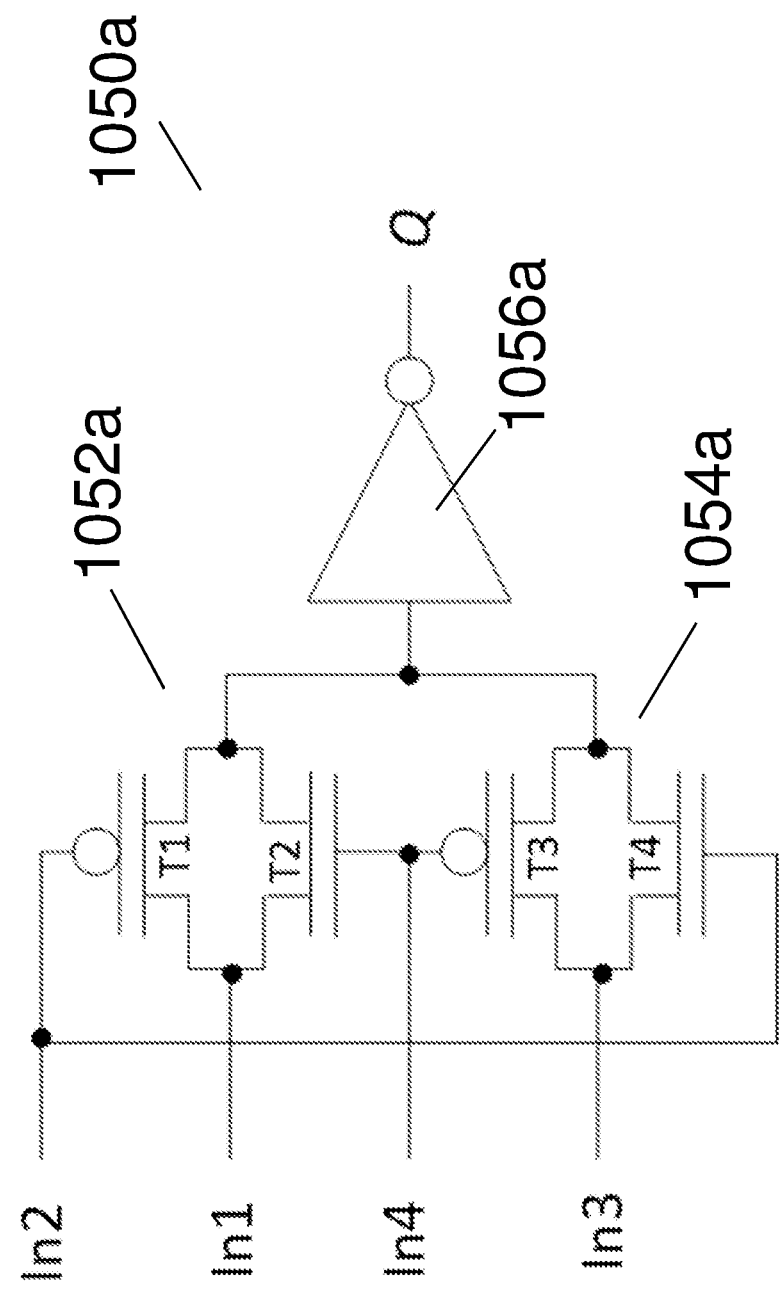
FIG. 10A is a schematic showing an integrated circuit layout arrangement including camouflage cells according to various embodiments.

FIG. 10A is a schematic showing an integrated circuit layout arrangement 1050a including camouflage cells according to various embodiments. The arrangement 1050a may be a 4-input gate, and may include cells 1052a, 1054a. Cell 1052a may include p-channel transistor T1, and n-channel transistor T2. Cell 1054a may include further p-channel transistor T3, and further n-channel transistor T4.

In 1 signal may be applied to the first controlled terminal of the p-channel transistor (T1) and the first controlled terminal of the n-channel transistor (T2). In 2 signal may be applied to the control terminal of the p-channel transistor (T1) and the control terminal of the further n-channel transistor (T4). In 3 signal may be applied to the first controlled terminal of the further p-channel transistor (T3) and the first controlled terminal of the further n-channel transistor (T4). In 4 signal may be applied to the control terminal of the n-channel transistor (T2) and the control terminal of the further p-channel transistor (T3). The second controlled terminal of the p-channel transistor (T1), the second controlled terminal of the n-channel transistor (T2), the second controlled terminal of the further p-channel transistor (T3), and the second controlled terminal of the further n-channel terminal (T4) may be connected to an input of an output inverter 1056a. The output inverter 1056a may serve as a buffer, and may generate output Q.

Figure 10B:
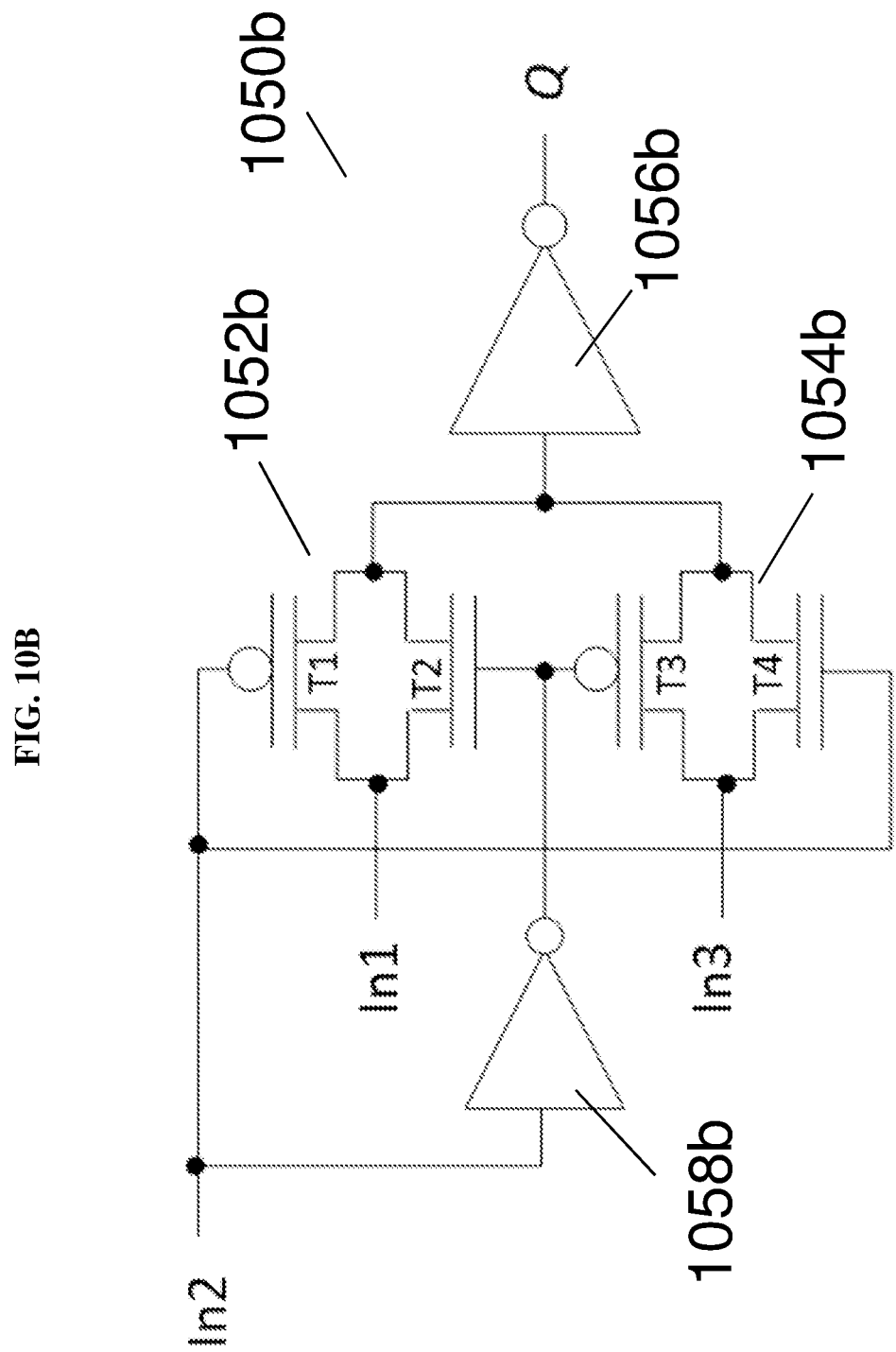
FIG. 10B is a schematic showing another integrated circuit layout arrangement including camouflage cells according to various embodiments.

FIG. 10B is a schematic showing another integrated circuit layout arrangement 1050b including camouflage cells according to various embodiments. The arrangement 1050b may be a 3-input gate, and may include cells 1052b, 1054b. Cell 1052b may include p-channel transistor T1, and n-channel transistor T2. Cell 1054b may include further p-channel transistor T3, and further n-channel transistor T4.

In 1 signal may be applied to the first controlled terminal of the p-channel transistor (T1) and the first controlled terminal of the n-channel transistor (T2). In 2 signal may be applied to the control terminal of the p-channel transistor (T1) and the control terminal of the further n-channel transistor (T4) and also to the input inverter 1058b. The output of the input inverter 1058b may be connected to the control terminal of the n-channel transistor (T2) and the control terminal of the further p-channel transistor (T3).

In 3 signal may be applied to the first controlled terminal of the further p-channel transistor (T3) and the first controlled terminal of the further n-channel transistor (T4). The second controlled terminal of the p-channel transistor (T1), the second controlled terminal of the n-channel transistor (T2), the second controlled terminal of the further p-channel transistor (T3), and the second controlled terminal of the further n-channel terminal (T4) may be connected to an input of an output inverter 1056b. The inverter 1056b may serve as a buffer, and may generate output Q.

Figure 10C:
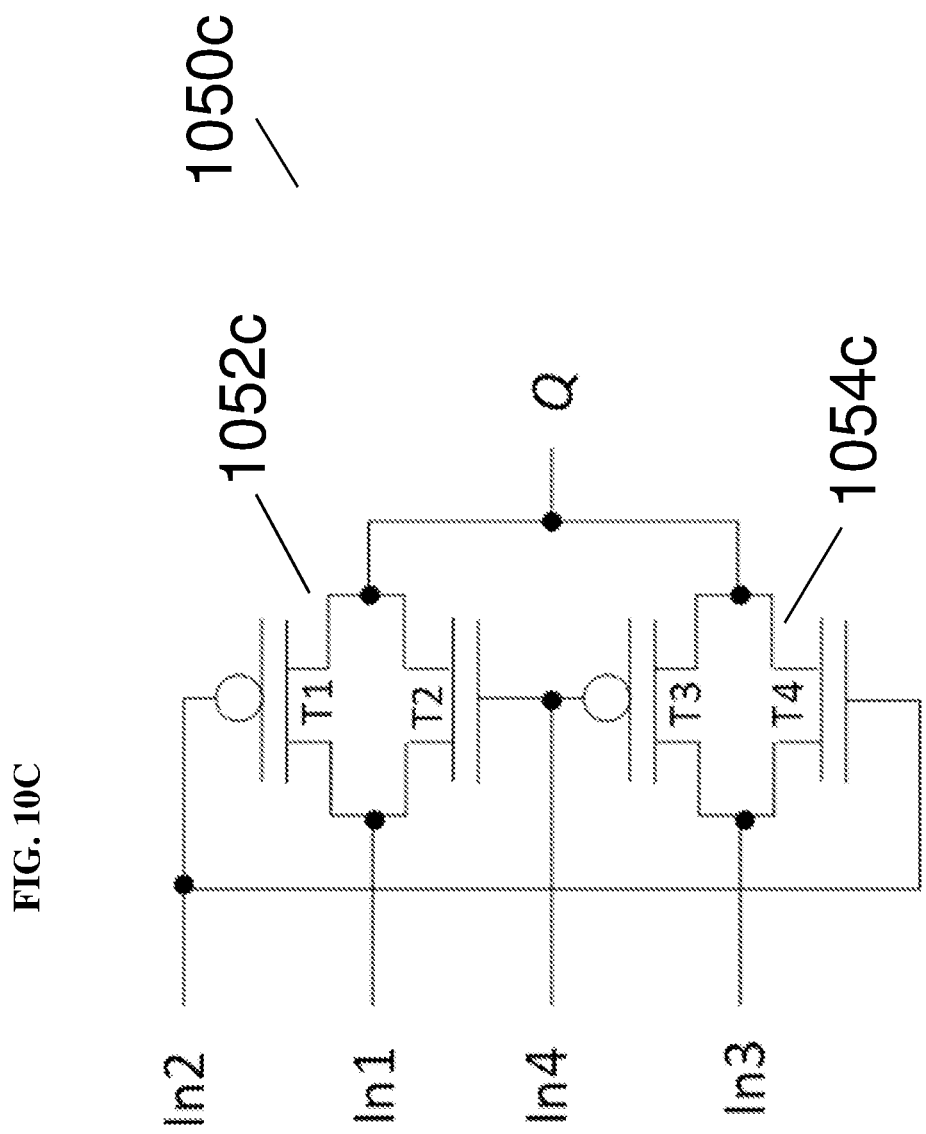
FIG. 10C is a schematic showing an integrated circuit layout arrangement including camouflage cells according to various embodiments.

FIG. 10C is a schematic showing an integrated circuit layout arrangement 1050c including camouflage cells according to various embodiments. The arrangement 1050c may be a 4-input gate, and may include cells 1052c, 1054c. Cell 1052c may include p-channel transistor T1, and n-channel transistor T2. Cell 1054c may include further p-channel transistor T3, and further n-channel transistor T4.

In 1 signal may be applied to the first controlled terminal of the p-channel transistor (T1) and the first controlled terminal of the n-channel transistor (T2). In 2 signal may be applied to the control terminal of the p-channel transistor (T1) and the control terminal of the further n-channel transistor (T4). In 3 signal may be applied to the first controlled terminal of the further p-channel transistor (T3) and the first controlled terminal of the further n-channel transistor (T4). In 4 signal may be applied to the control terminal of the n-channel transistor (T2) and the control terminal of the further p-channel transistor (T3). The second controlled terminal of the p-channel transistor (T1), the second controlled terminal of the n-channel transistor (T2), the second controlled terminal of the further p-channel transistor (T3), and the second controlled terminal of the further n-channel terminal (T4) may provide output Q.

Figure 10D:
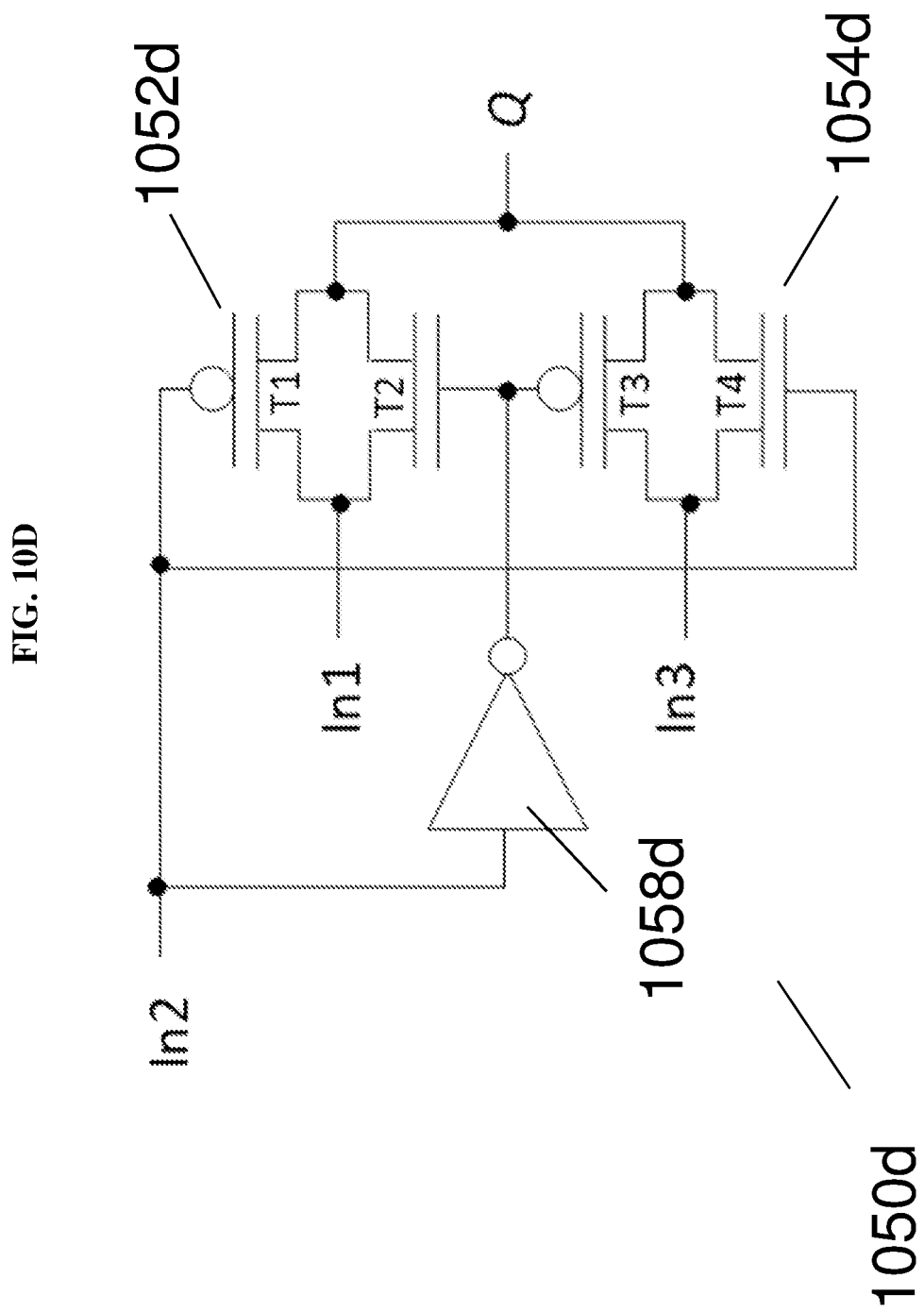
FIG. 10D is a schematic showing another integrated circuit layout arrangement including camouflage cells according to various embodiments.

FIG. 10D is a schematic showing another integrated circuit layout arrangement 1050d including camouflage cells according to various embodiments. The arrangement 1050d may be a 3-input gate, and may include cells 1052d, 1054d. Cell 1052d may include PMOS transistor T1, and NMOS transistor T2. Cell 1054d may include further PMOS transistor T3, and further NMOS transistor T4.

In 1 signal may be applied to the first controlled terminal of the p-channel transistor (T1) and the first controlled terminal of the n-channel transistor (T2). In 2 signal may be applied to the control terminal of the p-channel transistor (T1) and the control terminal of the further n-channel transistor (T4) and also to the input inverter 1058d. The output of the input inverter 1058d may be connected to the control terminal of the n-channel transistor (T2) and the control terminal of the further p-channel transistor (T3).

In 3 signal may be applied to the first controlled terminal of the further p-channel transistor (T3) and the first controlled terminal of the further n-channel transistor (T4). The second controlled terminal of the p-channel transistor (T1), the second controlled terminal of the n-channel transistor (T2), the second controlled terminal of the further p-channel transistor (T3), and the second controlled terminal of the further n-channel terminal (T4) may generate output Q.

FIGS. 10A-D depict various netlist designs. The arrangements in FIGS. 10A-B may include an output buffer, but the arrangements in FIGS. 10C-D may be without an output buffer. For all designs, the NFET and PFET regions for each of T1 to T4 may be arranged either near to the VDD power line or near to the ground power line. Particularly, the schematic design depicted in FIG. 10(c) may form a basic structure where each of T1 to T4 may be arranged such that the PFET and NFET regions are either close to the VDD power line or close to the ground power line.

Various embodiments may relate to a multiple-input gate. The inputs of the gate may or may not be buffered. The outputs of the gate may or may not be buffered.

Figure 11:
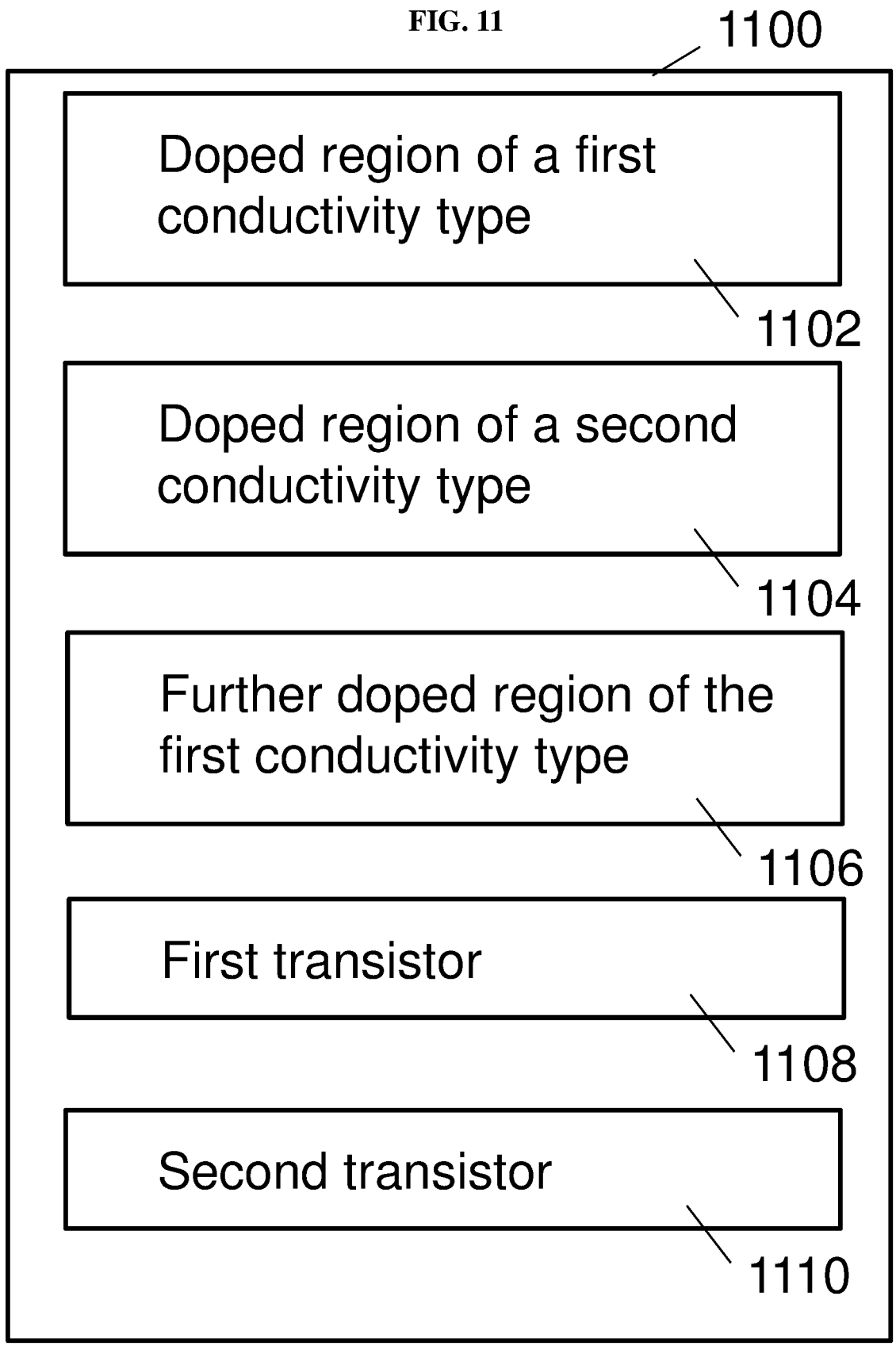
FIG. 11 is a general illustration of an integrated circuit layout cell according to various embodiments.

FIG. 11 is a general illustration of an integrated circuit layout cell 1100 according to various embodiments. The integrated circuit layout cell 1100 may include a doped region 1102 of a first conductivity type. The integrated circuit layout cell 1100 may also include a doped region 1104 of a second conductivity type opposite of the first conductivity type. The integrated circuit cell 1100 may additionally include a further doped region 1106 of the first conductivity type at least partially within the doped region 1104 of the second conductivity type, and continuous with the doped region 1102 of the first conductivity type. The integrated circuit cell 1100 may include a first transistor 1108 having a control terminal, a first controlled terminal, and a second controlled terminal. The first controlled terminal and the second controlled terminal of the first transistor 1108 may include terminal regions of the second conductivity type formed within the further doped region 1106 of the first conductivity type. The integrated circuit cell 1100 may also include a second transistor 1110 having a control terminal, a first controlled terminal, and a second controlled terminal. The first controlled terminal and the second controlled terminal of the second transistor 1110 may include terminal regions of the first conductivity type. The first controlled terminal of the first transistor 1108 may be in electrical connection with the first controlled terminal of the second transistor 1110. The second controlled terminal of the first transistor 1108 may be in electrical connection with the second controlled terminal of the second transistor 1110.

FIG. 11 serves to illustrate the features of an integrated circuit layout cell 1100 according to various embodiments, and does not limit for instance, the sizes, arrangement, orientation etc. of the different features.

In various embodiments, the terminal regions of the first conductivity type of the second transistor 1110 may be formed within the doped region of the second conductivity type 1104.

In various embodiments, the doped region of the first conductivity type 1102 and the further doped region of the first conductivity type may include n-type dopants 1106. The first transistor 1108 may be a p-channel transistor. The region 1106 of the second conductivity type may include p-type dopants. The second transistor 1110 may be an n-channel transistor.

In various other embodiments, the doped region 1102 of the first conductivity type and the further doped region 1104 of the first conductivity type may include p-type dopants. The first transistor 1108 may be an n-channel transistor. The doped region 1104 of the second conductivity type may include n-type dopants. The second transistor 1110 may be a p-channel transistor.

In yet various other embodiments, the integrated circuit layout cell 1100 may further include a further doped region of the second conductivity type at least partially within the doped region 1102 of the first conductivity type, and continuous with the doped region of the second conductivity type. The terminal regions of the first conductivity type of the second transistor may be formed within the further doped region of the second conductivity type. The doped region of the first conductivity type and the further doped region of the first conductivity type may include n-type dopants. The first transistor may be a p-channel transistor. The doped region of the second conductivity type and the further doped region of the second conductivity type may include p-type dopants. The second transistor may be an n-channel transistor.

In various embodiments, the integrated circuit layout cell 1100 may include a first power metal line and a second power metal line. The first power metal line may be configured to connect to a power supply. The second power metal line may be configured to connect to ground.

In embodiments where the doped region 1102 of the first conductivity type includes n-type dopants and the doped region 1104 of the second conductivity type includes p-type dopants, the first power metal line may be nearer to the doped region 1102 of the first conductivity type including n-type dopants than to the doped region 1104 of the second conductivity type including p-type dopants, and the second power metal line may be nearer to the doped region 1104 of the second conductivity type including p-type dopants than to the doped region 1102 of the first conductivity type including n-type dopants.

In embodiments where the doped region 1102 of the first conductivity type includes p-type dopants and the doped region 1104 of the second conductivity type includes n-type dopants, the first power metal line may be nearer to the doped region 1104 of the second conductivity type including n-type dopants than to the doped region 1102 of the first conductivity type including p-type dopants, and the second power metal line may be nearer to the doped region 1102 of the first conductivity type including p-type dopants than to the doped region 1104 of the second conductivity type including n-type dopants.

In any case, the first power metal line connected to the power supply (VDD) may be nearer to the doped region including n-type dopants compared to the doped region including p-type dopants. The second power metal line connected to ground (GND) may be nearer to the doped region including p-type dopants than to the doped region including n-type dopants.

In various embodiments, a size of the first transistor may be equal to a size of the second transistor. In various embodiments, the size of the first transistor may be less than 20% or 10% bigger or smaller than the size of the second transistor.

Figure 12:
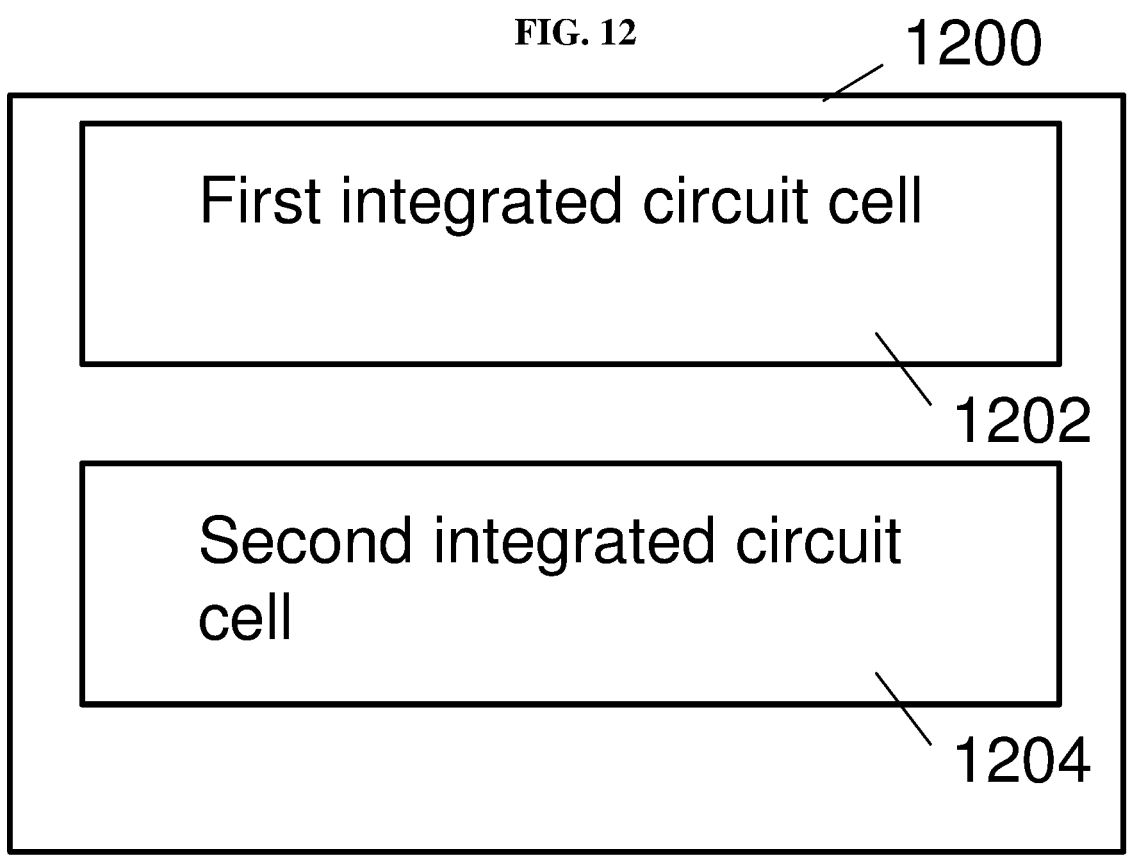
FIG. 12 is a general illustration of an integrated circuit layout arrangement according to various embodiments.

FIG. 12 is a general illustration of an integrated circuit layout arrangement 1200 according to various embodiments.

The integrated circuit layout arrangement 1200 may include a first integrated circuit layout cell 1202. The first integrated circuit layout cell 1202 may include a doped region of a first conductivity type. The first integrated circuit layout cell 1202 may also include a doped region of a second conductivity type opposite of the first conductivity type. The first integrated circuit layout cell 1202 may additionally include a further doped region of the first conductivity type at least partially within the doped region of the second conductivity type, and continuous with the doped region of the first conductivity type. The first integrated circuit layout cell 1202 may further include a first transistor having a control terminal, a first controlled terminal, and a second controlled terminal. The first controlled terminal and the second controlled terminal of the first transistor including terminal regions of the second conductivity type may be formed within the further doped region of the first conductivity type. The first integrated circuit layout cell 1202 may also include a second transistor having a control terminal, a first controlled terminal, and a second controlled terminal. The first controlled terminal and the second controlled terminal of the second transistor may include terminal regions of the first conductivity type. The first controlled terminal of the first transistor may be in electrical connection with the first controlled terminal of the second transistor. The second controlled terminal of the first transistor may be in electrical connection with the second controlled terminal of the second transistor.

The integrated circuit layout arrangement 1200 may additionally include a second integrated circuit layout cell 1204 including a p-channel transistor and an n-channel transistor. The p-channel transistor of the second integrated circuit layout cell 1204 may include a control terminal, a first controlled terminal, and a second controlled terminal. The n-channel transistor of the second integrated circuit layout cell 1204 may include a control terminal, a first controlled terminal, and a second controlled terminal. The first controlled terminal of the p-channel transistor of the second integrated circuit layout cell 1204 may be in electrical connection with the first controlled terminal of the n-channel transistor of the second integrated circuit layout cell 1204. The second controlled terminal of the p-channel transistor of the second integrated circuit layout cell 1204 may be in electrical connection with the second controlled terminal of the n-channel transistor of the second integrated circuit layout cell 1204.

FIG. 12 serves to illustrate the features of an integrated circuit layout arrangement 1200 according to various embodiments, and does not limit for instance, the sizes, arrangement, orientation etc. of the different features.

In various embodiments, the terminal regions of the first conductivity type of the second transistor of the first integrated circuit layout cell 1202 may be formed within the doped region of the second conductivity type of the first integrated circuit layout cell 1202.

In various embodiments, the doped region of the first conductivity type and the further doped region of the first conductivity type of the first integrated circuit layout cell 1202 may include n-type dopants. The first transistor of the first integrated circuit layout cell 1202 may be a p-channel transistor. The doped region of the second conductivity type of the first integrated circuit layout cell 1202 may include p-type dopants. The second transistor of the first integrated circuit layout cell 1202 may be an n-channel transistor.

The second integrated circuit layout cell 1204 may include a doped region including n-type dopants, a doped region including p-type dopants, as well as a further doped region including n-type dopants at least partially within the doped region including p-type dopants, and continuous with the doped region including n-type dopants. The first controlled terminal and the second controlled terminal of the p-channel transistor of the second integrated layout cell 1204 may include terminal regions including p-type dopants formed within the further doped region including n-type dopants of the second integrated layout cell 1204. The first controlled terminal and the second controlled terminal of the n-channel transistor of the second integrated layout cell 1204 may include terminal regions including n-type dopants formed within the doped region including p-type dopants of the second integrated layout cell 1204.

Alternatively, the second integrated circuit layout cell 1204 may include a doped region including n-type dopants, a doped region including p-type dopants, as well as a further doped region including p-type dopants at least partially within the doped region including n-type dopants, and continuous with the doped region including p-type dopants. The first controlled terminal and the second controlled terminal of the n-channel transistor of the second integrated layout cell 1204 may include terminal regions including n-type dopants formed within the further doped region comprising p-type dopants of the second integrated layout cell 1204. The first controlled terminal and the second controlled terminal of the p-channel transistor of the second integrated layout cell 1204 may include terminal regions including p-type dopants formed within the doped region including n-type dopants of the second integrated layout cell.

Alternatively, the second integrated circuit layout cell 1204 may include a doped region including n-type dopants, and a doped region including p-type dopants. The second integrated circuit layout cell 1204 may also include a further doped region including n-type dopants at least partially within the doped region including p-type dopants, and continuous with the doped region including n-type dopants. The second integrated circuit layout cell 1204 may additionally include a further doped region including p-type dopants at least partially within the doped region including n-type dopants, and continuous with the doped region including p-type dopants. The first controlled terminal and the second controlled terminal of the p-channel transistor of the second integrated layout cell 1204 may include terminal regions including p-type dopants formed within the further doped region including n-type dopants of the second integrated layout cell 1204. The first controlled terminal and the second controlled terminal of the n-channel transistor of the second integrated layout cell 1204 may also include terminal regions including n-type dopants formed within the further doped region including p-type dopants of the second integrated layout cell.

Alternatively, the second integrated circuit layout cell 1204 may include a doped region including n-type dopants, and a doped region including p-type dopants. The first controlled terminal and the second controlled terminal of the p-channel transistor of the second integrated layout cell 1204 may include terminal regions including p-type dopants formed within the doped region including n-type dopants of the second integrated layout cell 1204. The first controlled terminal and the second controlled terminal of the n-channel transistor of the second integrated layout cell 1204 may include terminal regions comprising n-type dopants formed within the doped region including p-type dopants of the second integrated layout cell 1204.

In various embodiments, the doped region of the first conductivity type and the further doped region of the first conductivity type of the first integrated circuit layout cell 1202 may include p-type dopants. The first transistor of the first integrated circuit layout cell 1202 may be an n-channel transistor. The doped region of the second conductivity type of the first integrated circuit layout cell 1202 may include n-type dopants. The second transistor of the first integrated circuit layout cell 1202 may be a p-channel transistor.

The second integrated circuit layout cell 1204 may include a doped region including n-type dopants, a doped region including p-type dopants, as well as a further doped region including p-type dopants at least partially within the doped region including n-type dopants, and continuous with the doped region including p-type dopants. The first controlled terminal and the second controlled terminal of the n-channel transistor of the second integrated layout cell 1204 may include terminal regions including n-type dopants formed within the further doped region including p-type dopants of the second integrated layout cell 1204. The first controlled terminal and the second controlled terminal of the p-channel transistor of the second integrated layout cell 1204 may include terminal regions including p-type dopants formed within the doped region including n-type dopants of the second integrated layout cell 1204.

Alternatively, the second integrated circuit layout cell 1204 may include a doped region including n-type dopants, and a doped region including p-type dopants. The second integrated circuit layout cell 1204 may include a further doped region including n-type dopants at least partially within the doped region including p-type dopants, and continuous with the doped region including n-type dopants. The second integrated circuit layout cell 1204 may also include a further doped region including p-type dopants at least partially within the doped region including n-type dopants, and continuous with the doped region including p-type dopants. The first controlled terminal and the second controlled terminal of the p-channel transistor of the second integrated layout cell 1204 may include terminal regions including p-type dopants formed within the further doped region including n-type dopants of the second integrated layout cell 1204. The first controlled terminal and the second controlled terminal of the n-channel transistor of the second integrated layout cell 1204 may include terminal regions including n-type dopants formed within the further doped region including p-type dopants of the second integrated layout cell 1204.

Alternatively, the second integrated circuit layout cell 1204 may include a doped region including n-type dopants, and a doped region including p-type dopants. The first controlled terminal and the second controlled terminal of the p-channel transistor of the second integrated layout cell 1204 may include terminal regions including p-type dopants formed within the doped region comprising n-type dopants of the second integrated layout cell. The first controlled terminal and the second controlled terminal of the n-channel transistor of the second integrated layout cell 1204 may include terminal regions including n-type dopants formed within the doped region comprising p-type dopants. of the second integrated layout cell 1204.

In various embodiments, the first integrated layout cell 1202 may further include a further doped region of the second conductivity type at least partially within the doped region of the first conductivity type, and continuous with the doped region of the second conductivity type. The terminal regions of the first conductivity type of the second transistor of the first integrated circuit layout cell 1202 may be formed within the further doped region of the second conductivity type of the first integrated circuit layout cell 1202. The doped region of the first conductivity type and the further doped region of the first conductivity type of the first integrated circuit layout cell 1202 may include n-type dopants. The first transistor of the first integrated circuit layout cell 1202 may be a p-channel transistor. The doped region of the second conductivity type and the further doped region of the second conductivity type of the first integrated circuit layout cell 1202 may include p-type dopants. The second transistor of the first integrated circuit layout cell 1202 may be an n-channel transistor.

The second integrated layout cell 1204 may include a doped region including n-type dopants, and a doped region including p-type dopants. The second integrated layout cell 1204 may also include a further doped region including n-type dopants at least partially within the doped region including p-type dopants, and continuous with the doped region including n-type dopants. The second integrated layout cell 1204 may also include a further doped region including p-type dopants at least partially within the doped region comprising n-type dopants, and continuous with the doped region including p-type dopants. The first controlled terminal and the second controlled terminal of the p-channel transistor of the second integrated layout cell 1204 may include terminal regions including p-type dopants formed within the further doped region including n-type dopants of the second integrated layout cell 1204. The first controlled terminal and the second controlled terminal of the n-channel transistor of the second integrated layout cell 1204 may include terminal regions including n-type dopants formed within the further doped region including p-type dopants of the second integrated layout cell 1204.

Alternatively, the second integrated layout cell 1204 may include a doped region including n-type dopants, and a doped region including p-type dopants. The first controlled terminal and the second controlled terminal of the p-channel transistor of the second integrated layout cell 1204 may include terminal regions including p-type dopants formed within the doped region including n-type dopants of the second integrated layout cell 1204. The first controlled terminal and the second controlled terminal of the n-channel transistor of the second integrated layout cell 1204 may include terminal regions including n-type dopants formed within the doped region including p-type dopants of the second integrated layout cell 1204.

In various embodiments, the doped region including n-type dopants of the second integrated circuit layout cell 1204 may be in electrical connection with the doped region including n-type dopants of the first integrated circuit layout cell 1202. The doped region including p-type dopants of the second integrated circuit layout cell 1204 may be in electrical connection with the doped region may include p-type dopants of the first integrated circuit layout cell 1202.

In various embodiments, the control terminal of the p-channel transistor of the first integrated layout cell 1202 may be connected to the control terminal of the n-channel transistor of the second integrated layout cell 1204. The control terminal of the n-channel transistor of the first integrated layout cell 1202 may be connected to the control terminal of the p-channel transistor of the second integrated layout cell 1204.

The control terminal of the p-channel transistor of the first integrated layout cell 1202 and the control terminal of the n-channel transistor of the second integrated layout cell 1204 may be configured to receive a first input signal. The control terminal of the n-channel transistor of the first integrated layout cell 1202 and the control terminal of the p-channel transistor of the second integrated layout cell 1204 may be configured to receive a second input signal complementary to the first input signal.

The integrated circuit layout arrangement 1200 may be configured to realize a logical function based on a third input signal provided to the first controlled terminal of the p-channel transistor of the first integrated layout cell 1202 and the first controlled terminal of the n-channel transistor of the first integrated layout cell 1202, and a fourth input signal provided to the first controlled terminal of the p-channel transistor of the second integrated layout cell 1204 and the first controlled terminal of the n-channel transistor of the second integrated layout cell 1204.

The integrated circuit layout arrangement 1200 may further include an output inverter having an input and an output. The input of the output inverter is connected to the second controlled terminal of the n-channel transistor of the first integrated layout cell 1202, the second controlled terminal of the p-channel transistor of the first integrated layout cell 1202, the second controlled terminal of the p-channel transistor of the second integrated layout cell 1204, and the second controlled terminal of the n-channel transistor of the second integrated layout cell 1204.

The integrated circuit layout arrangement 1200 may further include a first power metal line, and a second power metal line.

In embodiments in which the doped region of the first conductivity type (of cell 1202 and/or cell 1204) includes n-type dopants, and the doped region of the second conductivity type (of cell 1202 and/or cell 1204) includes p-type dopants, the first power metal line may be nearer to the doped region of the first conductivity type including n-type dopants than to the doped region of the second conductivity type including p-type dopants, and the second power metal line may be nearer to the doped region of the second conductivity type including p-type dopants than to the doped region of the first conductivity type including n-type dopants.

Conversely, in embodiments in which the doped region of the first conductivity type (of cell 1202 and/or cell 1204) includes p-type dopants, and the doped region of the second conductivity type (of cell 1202 and/or cell 1204) includes n-type dopants, the first power metal line may be nearer to the doped region of the second conductivity type including n-type dopants than to the doped region of the first conductivity type including p-type dopants, and the second power metal line may be nearer to the doped region of the first conductivity type including p-type dopants than to the doped region of the second conductivity type including n-type dopants.

In various embodiments, the first power metal line may be connected to the first controlled terminal of the p-channel transistor of the first integrated layout cell 1202 and the first controlled terminal of the n-channel transistor of the first integrated layout cell 1202 to provide the third input signal.

The first power metal line may be connected to the first controlled terminal of the p-channel transistor of the second integrated layout cell 1204 and the first controlled terminal of the n-channel transistor of the second integrated layout cell 1204 to provide the fourth input signal.

The second power metal line may be connected to the first controlled terminal of the p-channel transistor of the first integrated layout cell 1202 and the first controlled terminal of the n-channel transistor of the first integrated layout cell 1202 to provide the third input signal.

The second power metal line may be connected to the first controlled terminal of the p-channel transistor of the second integrated layout cell 1204 and the first controlled terminal of the n-channel transistor of the second integrated layout cell 1204 to provide the fourth input signal.

The first power metal line may be configured to connect to a power supply. The second power metal line may be configured to connect to ground.

In various embodiments, a size of the n-channel transistor of the first integrated layout cell 1202, a size of the p-channel transistor of the first integrated layout cell 1202, a size of the n-channel transistor of the second integrated layout cell 1204, and a size of the p-channel transistor of the second integrated layout cell 1204 may be equal. In various embodiments, a size of the n-channel transistor of the first integrated layout cell 1202, a size of the p-channel transistor of the first integrated layout cell 1202, a size of the n-channel transistor of the second integrated layout cell 1204, and/or a size of the p-channel transistor of the second integrated layout cell 1204 may be less than 20% or 10% bigger or smaller than one another.

Figure 13:
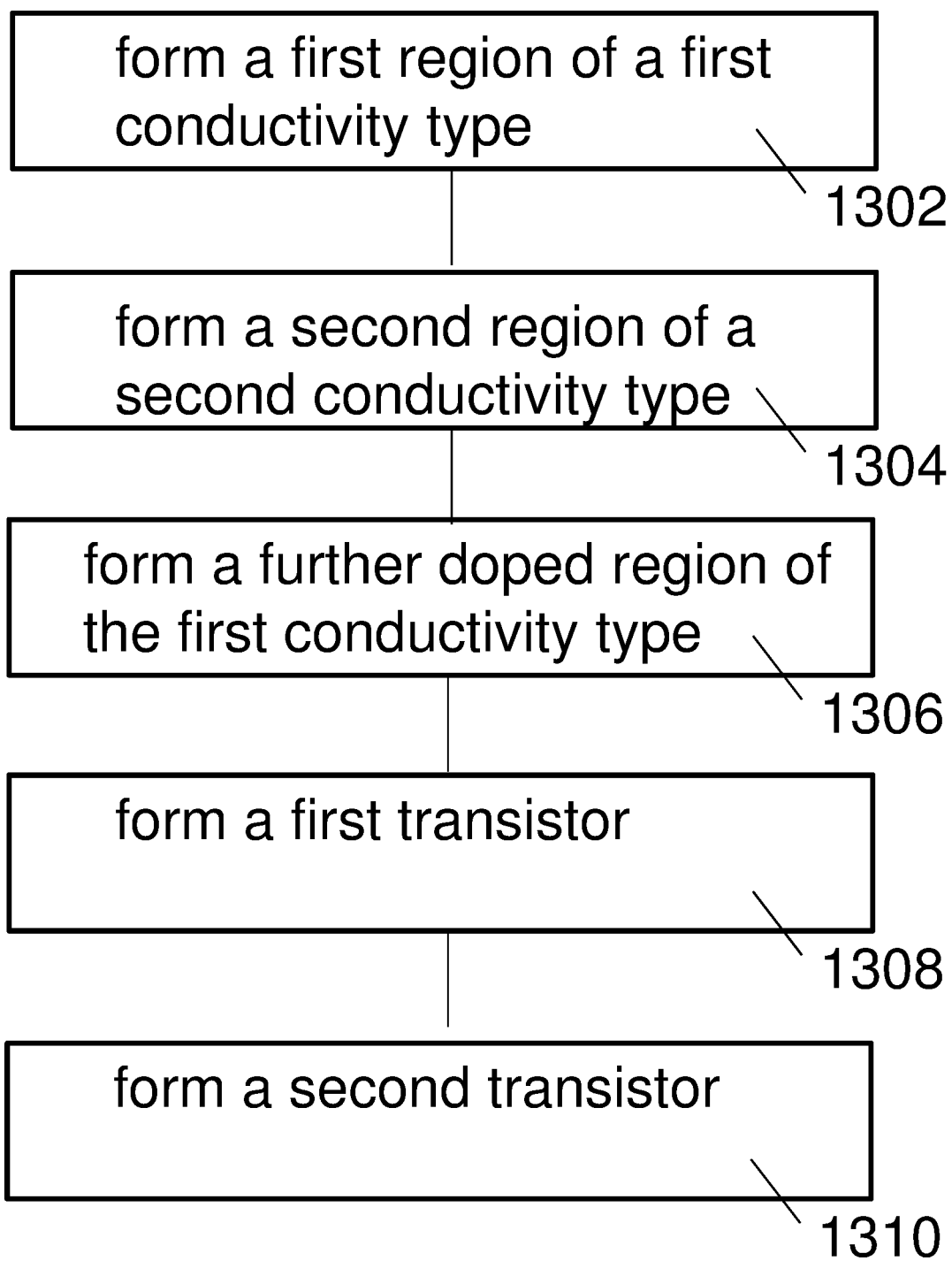
FIG. 13 shows a schematic illustrating a method of forming an integrated circuit layout arrangement according to various embodiments.

FIG. 13 shows a schematic illustrating a method of forming an integrated circuit layout cell according to various embodiments. The method may include, in 1302, forming a doped region of a first conductivity type. The method may also include, in 1304, forming a doped region of a second conductivity type opposite of the first conductivity type. The method may additionally include, in 1306, forming a further doped region of the first conductivity type at least partially within the doped region of the second conductivity type, and continuous with the doped region of the first conductivity type. The method may also include, in 1308, forming a first transistor having a control terminal, a first controlled terminal, and a second controlled terminal. The first controlled terminal and the second controlled terminal of the first transistor may include terminal regions of the second conductivity type formed within the further doped region of the first conductivity type. The method may additionally include, in 1310, forming a second transistor having a control terminal, a first controlled terminal, and a second controlled terminal. The first controlled terminal and the second controlled terminal of the second transistor may include terminal regions of the first conductivity type. The first controlled terminal of the first transistor may be in electrical connection with the first controlled terminal of the second transistor. The second controlled terminal of the first transistor may be in electrical connection with the second controlled terminal of the second transistor.

For avoidance of doubt, FIG. 13 may or may not be in sequence. For instance, step 1302 may be before, after, or at the same time as step 1304.

In various embodiments, the doped region of the second conductivity type may be formed after forming the doped region of the first conductivity type. Alternatively, the doped region of the second conductivity type may be formed before forming the doped region of the first conductivity type.

In various embodiments, the method may include forming a first power line. The method may also include forming a second power line.

Figure 14:
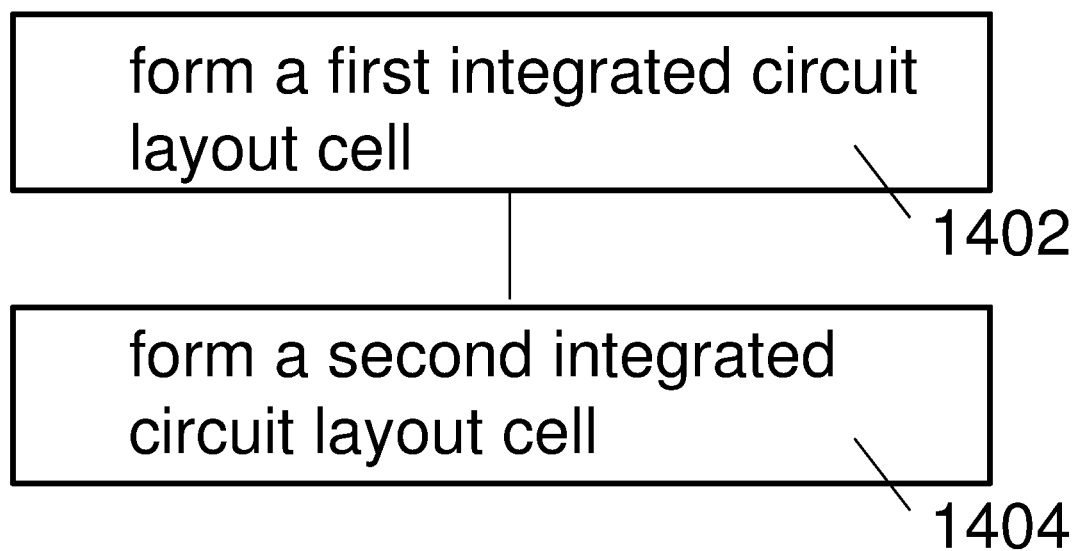
FIG. 14 shows a schematic illustrating a method of forming an integrated circuit layout arrangement according to various embodiments.

FIG. 14 shows a schematic illustrating a method of forming an integrated circuit layout arrangement. The method may include, in 1402, forming a first integrated circuit layout cell including a doped region of a first conductivity type, a doped region of a second conductivity type opposite of the first conductivity type, and a further doped region of the first conductivity type at least partially within the doped region of the second conductivity type, and continuous with the doped region of the first conductivity type. The first integrated layout cell may also include a first transistor having a control terminal, a first controlled terminal, and a second controlled terminal. The first controlled terminal and the second controlled terminal of the first transistor may include terminal regions of the second conductivity type formed within the further doped region of the first conductivity type. The first integrated layout cell may additionally include a second transistor having a control terminal, a first controlled terminal, and a second controlled terminal. The first controlled terminal and the second controlled terminal of the second transistor may include terminal regions of the first conductivity type. The first controlled terminal of the first transistor may be in electrical connection with the first controlled terminal of the second transistor. The second controlled terminal of the first transistor may be in electrical connection with the second controlled terminal of the second transistor. The method may also include, in 1404, forming a second integrated circuit layout cell including a p-channel transistor and an n-channel transistor. The p-channel transistor of the second integrated circuit layout cell may include a control terminal, a first controlled terminal, and a second controlled terminal. The n-channel transistor of the second integrated circuit layout cell may include a control terminal, a first controlled terminal, and a second controlled terminal. The first controlled terminal of the p-channel transistor of the second integrated circuit layout cell may be in electrical connection with the first controlled terminal of the n-channel transistor of the second integrated circuit layout cell. The second controlled terminal of the p-channel transistor of the second integrated circuit layout cell may be in electrical connection with the second controlled terminal of the n-channel transistor of the second integrated circuit layout cell.

For avoidance of doubt, FIG. 14 may or may not be in sequence. For instance, step 1402 may be before, after, or at the same time as step 1404.

In various embodiments, the method may also include forming a first power metal line, and forming a second power metal line.

Various embodiments may provide very high reverse engineering resistance and low cost, with reasonable area, speed and power overheads. Not all camouflage cells may be required to be replaced or swapped. Replacing about 100 camouflage cells per design may make the reverse engineering highly challenging. In other words, the reverse engineering resistance and the fabrication cost may be the most critical parameters, and various embodiments may outperform all the reported techniques.

Various embodiments may be fully compatible with any fabrication processes (i.e. without any special process treatment and modifications), hence more commercially-feasible and scalable.

Various embodiments may significantly increase the search space, hence extremely difficult to accurately extract and/or analyse the netlist (from reverse engineering). The increased difficulties may span from Delayering & Imaging, Image Annotation, and Netlist Analysis.

Various embodiments may occupy a small area, and may have lower power and delay overheads when compared to reported camouflage cells.

Various embodiments may be compatible with existing library cell templates, and may hence be more scalable to System-on-Chip integration.

Various embodiments may be suitable for use in hardware security to prevent reverse engineering on ICs.

Various embodiments may have applications in hardware security, particularly to prevent reverse engineering on ICs. The applications may include sectors related to banking, government agencies, defend/security related companies, IC design companies, IP providers, and many others.

For example, banking industries may adopt the camouflage ICs according to various embodiments to generate sensitive information such as password keys and confidential data.

IP providers may adopt the camouflage ICs according to various embodiments to prevent IP theft, i.e. prevent or deter third parties from stealing their new design idea.

A further example is that IC design companies may adopt the camouflage ICs according to various embodiments to prevent or deter chip manufacturers from reproducing ICs via reverse engineering.

An even further example is that FPGA companies may adopt the camouflage ICs according to various embodiments to prevent or deter adversaries to guess the programs stored in the FPGA chips.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:
1. An integrated circuit layout cell comprising:
a doped region of a first conductivity type;
a doped region of a second conductivity type opposite of the first conductivity type;
a further doped region of the first conductivity type at least partially within the doped region of the second conductivity type, and continuous with the doped region of the first conductivity type;
a first transistor having a control terminal, a first controlled terminal, and a second controlled terminal, the first controlled terminal and the second controlled terminal of the first transistor comprising terminal regions of the second conductivity type formed within the further doped region of the first conductivity type;

a second transistor having a control terminal, a first controlled terminal, and a second controlled terminal, the first controlled terminal and the second controlled terminal of the second transistor comprising terminal regions of the first conductivity type;

wherein the first controlled terminal of the first transistor is in electrical connection with the first controlled terminal of the second transistor; and wherein the second controlled terminal of the first transistor is in electrical connection with the second controlled terminal of the second transistor.

2. The integrated circuit layout cell according to claim 1, wherein the terminal regions of the first conductivity type of the second transistor are formed within the doped region of the second conductivity type.

3. The integrated circuit layout cell according to claim 2, wherein the doped region of the first conductivity type and the further doped region of the first conductivity type comprise n-type dopants;

wherein the first transistor is a p-channel transistor;

wherein the region of the second conductivity type comprises p-type dopants; and wherein the second transistor is an n-channel transistor.

4. The integrated circuit layout cell according to claim 2, wherein the doped region of the first conductivity type and the further doped region of the first conductivity type comprise p-type dopants;

wherein the first transistor is an n-channel transistor;

wherein the doped region of the second conductivity type comprises n-type dopants; and wherein the second transistor is a p-channel transistor.

5. The integrated circuit layout cell according to claim 1, wherein the integrated circuit layout cell further comprises a further doped region of the second conductivity type at least partially within the doped region of the first conductivity type, and continuous with the doped region of the second conductivity type;

wherein the terminal regions of the first conductivity type of the second transistor are formed within the further doped region of the second conductivity type;

wherein the doped region of the first conductivity type and the further doped region of the first conductivity type comprise n-type dopants;

wherein the first transistor is a p-channel transistor;

wherein the doped region of the second conductivity type and the further doped region of the second conductivity type comprise p-type dopants; and wherein the second transistor is an n-channel transistor.

6. The integrated circuit layout cell according to claim 3, further comprising:

a first power metal line; and a second power metal line;

wherein the first power metal line is nearer to the doped region of the first conductivity type comprising n-type dopants than to the doped region of the second conductivity type comprising p-type dopants; and wherein the second power metal line is nearer to the doped region of the second conductivity type comprising p-type dopants than to the doped region of the first conductivity type comprising n-type dopants.

7. The integrated circuit layout cell according to claim 4, further comprising:

a first power metal line; and a second power metal line;

wherein the first power metal line is nearer to the doped region of the second conductivity type comprising n-type dopants than to the doped region of the first conductivity type comprising p-type dopants; and wherein the second power metal line is nearer to the doped region of the first conductivity type comprising p-type dopants than to the doped region of the second conductivity type comprising n-type dopants.

8. The integrated circuit layout cell according to any one of claim 1, wherein a size of the first transistor is equal to a size of the second transistor.

9. An integrated circuit layout arrangement comprising:

a first integrated circuit layout cell comprising:

a doped region of a first conductivity type;

a doped region of a second conductivity type opposite of the first conductivity type;

a further doped region of the first conductivity type at least partially within the doped region of the second conductivity type, and continuous with the doped region of the first conductivity type;

a first transistor having a control terminal, a first controlled terminal, and a second controlled terminal, the first controlled terminal and the second controlled terminal of the first transistor comprising terminal regions of the second conductivity type formed within the further doped region of the first conductivity type;

a second transistor having a control terminal, a first controlled terminal, and a second controlled terminal, the first controlled terminal and the second controlled terminal of the second transistor comprising terminal regions of the first conductivity type;

wherein the first controlled terminal of the first transistor is in electrical connection with the first controlled terminal of the second transistor; and wherein the second controlled terminal of the first transistor is in electrical connection with the second controlled terminal of the second transistor; and a second integrated circuit layout cell comprising a p-channel transistor and an n-channel transistor;

wherein the p-channel transistor of the second integrated circuit layout cell comprises a control terminal, a first controlled terminal, and a second controlled terminal;

wherein the n-channel transistor of the second integrated circuit layout cell comprises a control terminal, a first controlled terminal, and a second controlled terminal;

wherein the first controlled terminal of the p-channel transistor of the second integrated circuit layout cell is in electrical connection with the first controlled terminal of the n-channel transistor of the second integrated circuit layout cell; and wherein the second controlled terminal of the p-channel transistor of the second integrated circuit layout cell is in electrical connection with the second controlled terminal of the n-channel transistor of the second integrated circuit layout cell.

10. The integrated circuit layout arrangement according to claim 9, wherein the terminal regions of the first conductivity type of the second transistor of the first integrated circuit layout cell are formed within the doped region of the second conductivity type of the first integrated circuit layout cell.

11. The integrated circuit layout arrangement according to claim 10,
wherein the doped region of the first conductivity type and the further doped region of the first conductivity type of the first integrated circuit layout cell comprise n-type dopants;
wherein the first transistor of the first integrated circuit layout cell is a p-channel transistor;
wherein the doped region of the second conductivity type of the first integrated circuit layout cell comprises p-type dopants; and
wherein the second transistor of the first integrated circuit layout cell is an n-channel transistor.

12. The integrated circuit layout arrangement according to claim 10,
wherein the doped region of the first conductivity type and the further doped region of the first conductivity type of the first integrated circuit layout cell comprise p-type dopants;
wherein the first transistor of the first integrated circuit layout cell is an n-channel transistor;
wherein the doped region of the second conductivity type of the first integrated circuit layout cell comprises n-type dopants; and
wherein the second transistor of the first integrated circuit layout cell is a p-channel transistor.

13. The integrated circuit layout arrangement according to claim 9,
wherein the first integrated circuit layout cell further comprises a further doped region of the second conductivity type at least partially within the doped region of the first conductivity type, and continuous with the doped region of the second conductivity type;
wherein the terminal regions of the first conductivity type of the second transistor of the first integrated circuit layout cell are formed within the further doped region of the second conductivity type of the first integrated circuit layout cell; wherein the doped region of the first conductivity type and the further doped region of the first conductivity type of the first integrated circuit layout cell comprise n-type dopants;
wherein the first transistor of the first integrated circuit layout cell is a p-channel transistor;
wherein the doped region of the second conductivity type and the further doped region of the second conductivity type of the first integrated circuit layout cell comprise p-type dopants; and
wherein the second transistor of the first integrated circuit layout cell is an n-channel transistor.

14. The integrated circuit layout arrangement according to claim 13,
wherein the second integrated circuit layout cell comprises:
a doped region comprising n-type dopants;
a doped region comprising p-type dopants;
a further doped region comprising n-type dopants at least partially within the doped region comprising p-type dopants, and continuous with the doped region comprising n-type dopants;
a further doped region comprising p-type dopants at least partially within the doped region comprising n-type dopants, and continuous with the doped region comprising p-type dopants;
wherein the first controlled terminal and the second controlled terminal of the p-channel transistor of the second integrated circuit layout cell comprise terminal regions including p-type dopants formed within the further doped region comprising n-type dopants of the second integrated circuit layout cell; and
wherein the first controlled terminal and the second controlled terminal of the n-channel transistor of the second integrated circuit layout cell comprise terminal regions comprising n-type dopants formed within the further doped region comprising p-type dopants of the second integrated circuit layout cell.

15. The integrated circuit layout arrangement according to claim 11,
wherein the control terminal of the p-channel transistor of the first integrated circuit layout cell is connected to the control terminal of the n-channel transistor of the second integrated circuit layout cell; and
wherein the control terminal of the n-channel transistor of the first integrated circuit layout cell is connected to the control terminal of the p-channel transistor of the second integrated circuit layout cell.

16. The integrated circuit layout arrangement according to claim 15,
wherein the control terminal of the p-channel transistor of the first integrated circuit layout cell and the control terminal of the n-channel transistor of the second integrated circuit layout cell are configured to receive a first input signal;
wherein the control terminal of the n-channel transistor of the first integrated circuit layout cell and the control terminal of the p-channel transistor of the second integrated circuit layout cell are configured to receive a second input signal complementary to the first input signal; and
wherein the integrated circuit layout arrangement is configured to realize a logical function based on a third input signal provided to the first controlled terminal of the p-channel transistor of the first integrated circuit layout cell and the first controlled terminal of the n-channel transistor of the first integrated circuit layout cell, and a fourth input signal provided to the first controlled terminal of the p-channel transistor of the second integrated circuit layout cell and the first controlled terminal of the n-channel transistor of the second integrated citcuit layout cell.

17. The integrated circuit layout arrangement according to claim 16, further comprising:
an output inverter having an input and an output;
wherein the input of the output inverter is connected to the second controlled terminal of the n-channel transistor of the first integrated circuit layout cell, the second controlled terminal of the p-channel transistor of the first integrated circuit layout cell, the second controlled terminal of the p-channel transistor of the second integrated circuit layout cell, and the second controlled terminal of the n-channel transistor of the second integrated circuit layout cell.

18. The integrated circuit layout arrangement according to claim 11,
wherein a size of the n-channel transistor of the first integrated circuit layout cell, a size of the p-channel transistor of the first integrated circuit layout cell, a size of the n-channel transistor of the second integrated circuit layout cell, and a size of the p-channel transistor of the second integrated circuit layout cell are equal.

19. A method of forming an integrated circuit layout cell, the method comprising:
forming a doped region of a first conductivity type;
forming a doped region of a second conductivity type opposite of the first conductivity type;

forming a further doped region of the first conductivity type at least partially within the doped region of the second conductivity type, and continuous with the doped region of the first conductivity type;

forming a first transistor having a control terminal, a first controlled terminal, and a second controlled terminal, the first controlled terminal and the second controlled terminal of the first transistor comprising terminal regions of the second conductivity type formed within the further doped region of the first conductivity type;

forming a second transistor having a control terminal, a first controlled terminal, and a second controlled terminal, the first controlled terminal and the second controlled terminal of the second transistor comprising terminal regions of the first conductivity type;

wherein the first controlled terminal of the first transistor is in electrical connection with the first controlled terminal of the second transistor; and wherein the second controlled terminal of the first transistor is in electrical connection with the second controlled terminal of the second transistor.

20. A method of forming an integrated circuit layout arrangement, the method comprising:

forming a first integrated circuit layout cell comprising:
 a doped region of a first conductivity type;
 a doped region of a second conductivity type opposite of the first conductivity type;
 a further doped region of the first conductivity type at least partially within the doped region of the second conductivity type, and continuous with the doped region of the first conductivity type;
 a first transistor having a control terminal, a first controlled terminal, and a second controlled terminal, the first controlled terminal and the second controlled terminal of the first transistor comprising terminal regions of the second conductivity type formed within the further doped region of the first conductivity type;
 a second transistor having a control terminal, a first controlled terminal, and a second controlled terminal, the first controlled terminal and the second controlled terminal of the second transistor comprising terminal regions of the first conductivity type;
 wherein the first controlled terminal of the first transistor is in electrical connection with the first controlled terminal of the second transistor; and
 wherein the second controlled terminal of the first transistor is in electrical connection with the second controlled terminal of the second transistor; and forming a second integrated circuit layout cell comprising a p-channel transistor and an n-channel transistor;

wherein the p-channel transistor of the second integrated circuit layout cell comprises a control terminal, a first controlled terminal, and a second controlled terminal;

wherein the n-channel transistor of the second integrated circuit layout cell comprises a control terminal, a first controlled terminal, and a second controlled terminal;

wherein the first controlled terminal of the p-channel transistor of the second integrated circuit layout cell is in electrical connection with the first controlled terminal of the n-channel transistor of the second integrated circuit layout cell; and wherein the second controlled terminal of the p-channel transistor of the second integrated circuit layout cell is in electrical connection with the second controlled terminal of the n-channel transistor of the second integrated circuit layout cell.

\* \* \* \* \*

UNITED STATES PATENT AND TRADEMARK OFFICE
CERTIFICATE OF CORRECTION

| | | |
|---|---|---|
| PATENT NO. | : 11,695,011 B2 | Page 1 of 1 |
| APPLICATION NO. | : 17/052164 | |
| DATED | : July 4, 2023 | |
| INVENTOR(S) | : Kwen Siong Chong et al. | |

It is certified that error appears in the above-identified patent and that said Letters Patent is hereby corrected as shown below:

On the Title Page

<u>Item (72)</u>
"Kwen Siong CHONG, Singapore (SG); Bah Hwee GWEE, Singapore (SG); Weng Geng HO, Singapore (SG); Ne Kyaw Zaw LWIN, Singapore (SG)" should read, -- Kwen Siong CHONG, Singapore (SG); Bah Hwee GWEE, Singapore (SG); Weng Geng HO, Singapore (SG); Ne Kyaw Zwa LWIN, Singapore (SG) --.

Signed and Sealed this
Twenty-ninth Day of July, 2025

Coke Morgan Stewart
*Acting Director of the United States Patent and Trademark Office*